(12) United States Patent
Park et al.

(10) Patent No.: US 11,877,487 B2
(45) Date of Patent: Jan. 16, 2024

(54) DISPLAY APPARATUS

(71) Applicant: Samsung Display Co., Ltd., Yongin-si (KR)

(72) Inventors: Hyungjun Park, Yongin-si (KR); Junyong An, Yongin-si (KR); Nuree Um, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/883,520

(22) Filed: Aug. 8, 2022

(65) Prior Publication Data

US 2023/0043605 A1 Feb. 9, 2023

(30) Foreign Application Priority Data

Aug. 9, 2021 (KR) .......................... 10-2021-0104806

(51) Int. Cl.
*H10K 59/131* (2023.01)
*G09G 3/3233* (2016.01)
*H10K 59/126* (2023.01)

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0842* (2013.01); *G09G 2320/0209* (2013.01); *G09G 2320/0626* (2013.01); *G09G 2330/10* (2013.01); *H10K 59/126* (2023.02)

(58) Field of Classification Search
CPC .. G09G 3/3233; G09G 3/3291; G09G 3/3258; H10K 59/121

See application file for complete search history.

(56) References Cited

U.S. PATENT DOCUMENTS

| | | | |
|---|---|---|---|
| 7,535,444 B2 | 5/2009 | Kim | |
| 9,576,522 B2 | 2/2017 | Kim et al. | |
| 10,062,743 B2 | 8/2018 | Lee et al. | |
| 10,692,956 B2 | 6/2020 | Choi et al. | |
| 11,094,771 B2* | 8/2021 | Cho | ............ H10K 59/124 |
| 11,469,291 B2* | 10/2022 | Diao | ............ H01L 27/1214 |
| 2016/0125809 A1* | 5/2016 | Hwang | ............ G09G 3/3258 |
| | | | 345/212 |
| 2022/0199747 A1 | 6/2022 | Jung et al. | |

FOREIGN PATENT DOCUMENTS

| | | |
|---|---|---|
| KR | 10-0573156 | 4/2006 |
| KR | 10-2017-0127602 | 11/2017 |
| KR | 10-2018-0088551 | 8/2018 |
| KR | 10-2000643 | 7/2019 |
| KR | 10-2022-0087663 | 6/2022 |

\* cited by examiner

*Primary Examiner* — Sardis F Azongha
(74) *Attorney, Agent, or Firm* — H.C. Park & Associates, PLC

(57) ABSTRACT

A display apparatus including first-through-third pixels sequentially arranged in a row direction, a first shielding electrode arranged between the first pixel and the second pixel, a first voltage line configured to transmit a first initialization voltage, a second voltage line configured to transmit a second initialization voltage, a first contact plug connecting the first pixel and the second pixel to the first voltage line, a second contact plug connecting the second pixel and the third pixel to the second voltage line, and a third contact plug connecting the first shielding electrode to the first voltage line.

20 Claims, 10 Drawing Sheets

DISPLAY APPARATUS

CROSS-REFERENCE TO RELATED APPLICATION

This application claims priority from and the benefit of Korean Patent Application No. 10-2021-0104806, filed on Aug. 9, 2021, which is hereby incorporated by reference for all purposes as if fully set forth herein.

BACKGROUND

Field

Embodiments of the invention relate generally to a display apparatus.

Discussion of the Background

A display apparatus is an apparatus that visually displays data. A display apparatus may be used as a display of a small-sized product, such as a cellular phone, or a display of a large-sized product, such as a television.

The display apparatus may include a plurality of pixels, which receive an electrical signal and then emit light, to display an image to the outside. Each pixel may include a light-emitting device. For example, in the case of an organic light-emitting display apparatus, an organic light-emitting diode may be included as the light-emitting device. Generally, an organic light-emitting display apparatus may include a thin-film transistor and an organic light-emitting diode on a substrate, and the organic light-emitting diode may directly emit light.

Recently, with the diversified usage of a display apparatus, various attempts have been made to develop designs to improve the quality of a display apparatus.

The above information disclosed in this Background section is only for understanding of the background of the inventive concepts, and, therefore, it may contain information that does not constitute prior art.

SUMMARY

Embodiments of the invention are directed to a display apparatus capable of preventing defects of pixels caused by static electricity generated from the outside.

Additional features of the inventive concepts will be set forth in the description which follows, and in part will be apparent from the description, or may be learned by practice of the inventive concepts.

According to one or more embodiments, a display apparatus includes first-through-third pixels sequentially arranged in a row direction, a first shielding electrode arranged between the first pixel and the second pixel, a first voltage line configured to transmit a first initialization voltage, a second voltage line configured to transmit a second initialization voltage, a first contact plug connecting the first pixel and the second pixel to the first voltage line, a second contact plug connecting the second pixel and the third pixel to the second voltage line, and a third contact plug connecting the first shielding electrode to the first voltage line.

The display apparatus may further include a second shielding electrode arranged between the second pixel and the third pixel and a fourth contact plug connecting the second shielding electrode to the second voltage line.

The display apparatus may further include first-through-third power lines sequentially arranged and apart from each other in the row direction. The first power line may be configured to transmit a driving voltage to the first pixel, the second power line may be configured to transmit the driving voltage to the second pixel, and the third power line may be configured to transmit the driving voltage to the third pixel.

The display apparatus may further include a third shielding electrode adjacent to the first shielding electrode in a column direction and at least one fifth contact plug connecting the third shielding electrode to at least one of the first-through-third power lines.

The first voltage line may extend in a column direction and be arranged between the first power line and the second power line, the second voltage line may extend in the column direction and be arranged between the second power line and the third power line, the first power line and the second power line may be symmetrical with each other with respect to the first voltage line, and the second power line and the third power line may be symmetrical with each other with respect to the second voltage line.

The first-through-third power lines may have a same shape in a plan view.

The display apparatus may further include a first connection electrode connecting the first power line with the second power line and a second connection electrode connecting the second power line with the third power line. The first-through-third power lines may extend in a column direction, and the first connection electrode and the second connection electrode may extend in the row direction.

A first length of the first connection electrode in the row direction may be greater than a second length of the second connection electrode in the row direction.

A first length of the first connection electrode in the row direction may be equal to a second length of the second connection electrode in the row direction.

The display apparatus may further include a first data line configured to transmit a first data voltage to the first pixel and a second data line configured to transmit a second data voltage to the second pixel. The first data line and the second data line may at least partially overlap the first shielding electrode.

Each of the first-through-third pixels may include a light-emitting device, a driving transistor configured to control a current flowing to the light-emitting device according to a gate-source voltage, a first initialization transistor configured to apply one of the first initialization voltage and the second initialization voltage to an electrode of the driving transistor in response to a first scan signal, and a second initialization transistor configured to apply the other of the first initialization voltage and the second initialization voltage to an electrode of the light-emitting device in response to a second scan signal.

According to one or more embodiments, a display apparatus includes a semiconductor pattern integrally provided and continually extending in a row direction, at least one first shielding electrode arranged on a same layer as the semiconductor pattern and apart from the semiconductor pattern, at least one first voltage line configured to transmit a first initialization voltage, and at least one first contact plug connecting the at least one first shielding electrode to the at least one first voltage line.

The display apparatus may further include at least one second shielding electrode arranged on a same layer as the semiconductor pattern and apart from the semiconductor pattern, at least one second voltage line configured to transmit a second initialization voltage, and at least one second contact plug connecting the at least one second shielding electrode to the at least one second voltage line.

The at least one first shielding electrode and the at least one second shielding electrode may be provided in plurality, and the plurality of first shielding electrodes and the plurality of second shielding electrodes may be alternately arranged with each other in the row direction.

The display apparatus may further include a plurality of power lines configured to transmit a driving voltage to the semiconductor pattern and arranged to be apart from each other in the row direction and a plurality of connection electrodes connecting power lines adjacent to each other in the row direction from among the plurality of power lines with each other, respectively.

The display apparatus may further include an insulating layer arranged between the semiconductor pattern and the plurality of power lines. Each of the plurality of power lines may have an opening exposing at least a portion of the insulating layer.

The display apparatus may further include at least one third shielding electrode, which extends from the semiconductor pattern, and to which a driving voltage is applied. The at least one first shielding electrode and the at least one third shielding electrode may be adjacent to each other in a column direction.

The display apparatus may further include a plurality of pixels arranged in the row direction and a plurality of second voltage lines configured to transmit a second initialization voltage. Also, the at least one first voltage line may be provided in plurality, a pixel in a $2j-1^{th}$ column and a pixel in a $2j^{th}$ column from among the plurality of pixels may share a plurality of first contact plugs connecting the pixel in the $2j-1^{th}$ column and the pixel in the $2j^{th}$ column to the plurality of first voltage lines, the pixel in the $2j^{th}$ column and a pixel in a $2j+1^{th}$ column from among the plurality of pixels may share a plurality of second contact plugs connecting the pixel in the $2j^{th}$ column and the pixel in the $2j+1^{th}$ column to the plurality of second voltage lines, and the semiconductor pattern may include a plurality of pixel areas included in the plurality of pixels, respectively, a plurality of first contact areas corresponding to the plurality of first contact plugs, respectively, and a plurality of second contact areas corresponding to the plurality of second contact plugs, respectively. (where j is a natural number.)

The plurality of first contact areas may connect a pixel area in the $2j-1^{th}$ column with a pixel area in the $2j^{th}$ column from among the plurality of pixel areas, respectively, and the plurality of second contact areas may connect the pixel area in the $2j^{th}$ column with a pixel area in the $2j+1^{th}$ column from among the plurality of pixel areas, respectively.

The at last one first shielding electrode may be provided in plurality, and the plurality of first shielding electrodes may be arranged between a pixel area in the $2j-1^{th}$ column and a pixel area in the $2j^{th}$ column from among the plurality of pixel areas, respectively.

These general and specific embodiments may be implemented by using a system, a method, a computer program, or a combination of the system, the method, and the computer program.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
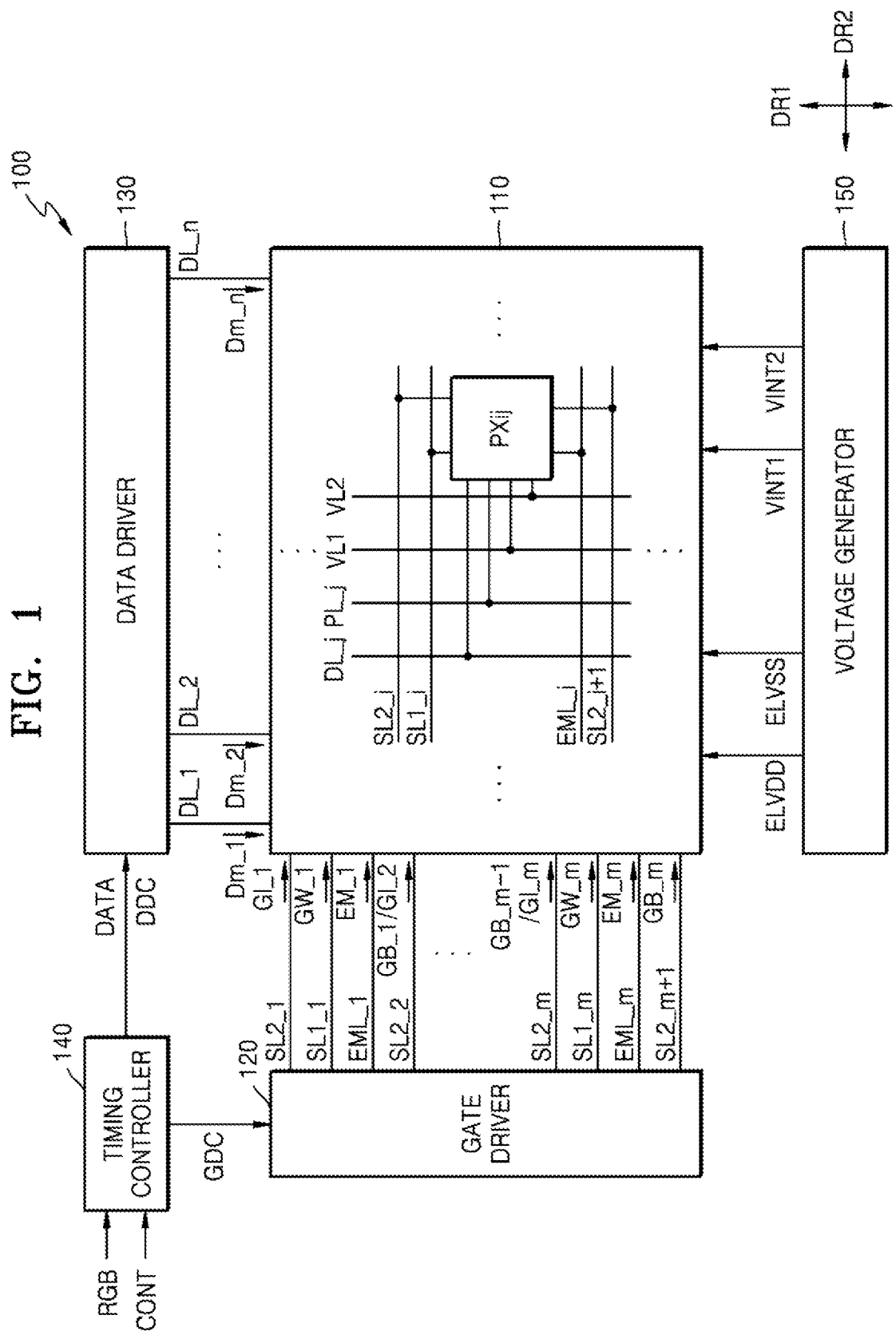
FIG. 1 is a schematic block diagram of a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic block diagram of a display apparatus according to an embodiment.

The display apparatus may include an organic light-emitting display apparatus including a light-emitting device, a luminance of which is changed according to a current, for example, an organic light-emitting diode. Alternatively, the display apparatus may include an inorganic light-emitting display apparatus, an inorganic electroluminescent (EL) display apparatus, or a quantum dot light-emitting display apparatus. That is, an emission layer of the light-emitting device included in the display apparatus may include an organic material, an inorganic material, quantum dots, an organic material and quantum dots, an inorganic material and quantum dots, or an organic material, an inorganic material, and quantum dots. Hereinafter, a case in which the display apparatus corresponds to the organic light-emitting display apparatus is mainly described in detail.

Referring to FIG. 1, an organic light-emitting display apparatus 100 may include a display 110, a gate driver 120, a data driver 130, a timing controller 140, and a voltage generator 150.

The display 110 may include pixels PX, such as a pixel PXij in an $i^{th}$ row and a $j^{th}$ column. For convenience of understanding, FIG. 1 illustrates one pixel PXij. However, m×n pixels PX may be arranged, for example, in the form of a matrix. Here, "i" is a natural number that is equal to or greater than 1 and equal to or less than m, and "j" is a natural number that is equal to or greater than 1 and equal to or less than n.

With respect to FIG. 1, descriptions are given based on the example of a pixel PX including seven transistors and one capacitor. However, the inventive concepts may not be applied only to the pixel PX implementing this particular pixel circuit described above. The inventive concepts may also be applied to pixels PX implementing other pixel circuits, for example, a pixel PX including two transistors and one capacitor.

The pixels PX may be connected to first scan lines SL1_1 through SL1_m, second scan lines SL2_1 through SL2_m+1, emission control lines EML_1 through EML_m, and data lines DL_1 through DL_n. The pixels PX may be connected to power lines PL_1 through PL_n, a first voltage line VL1, and a second voltage line VL2. For example, as illustrated in FIG. 1, the pixel PXij in the $i^{th}$ row and the $j^{th}$ column may be connected to the first scan line SL1_i, the second scan line SL2_i, the emission control line EML_i, the data line DL_j, the power line PL_j, the first voltage line VL1, the second voltage line VL2, and the second scan line SL2_i+1. The second scan line SL2_i+1 may be referred to as a third scan line with respect to the pixel PXij.

As another example, the pixel PXij may be connected to one or more from among the first scan line SL1_i, the second scan line SL2_i, the emission control line EML_i, the data line DL_j, the power line PL_j, the first voltage line VL1, the second voltage line VL2, and the second scan line SL2_i+1. For example, the pixel PXij may be connected to the first scan line SL1_i, the data line DL_j, and the power line PL_j.

The data lines DL_1 through DL_n and the power lines PL_1 through PL_n may extend in a first direction (or a column direction) DR1 and may be connected to the pixels PX in the same column. The first scan lines SL1_1 through SL1_m, the second scan lines SL2_1 through SL2_m+1, and the emission control lines EML_1 through EML_m may extend in a second direction (or a row direction) DR2 and may be connected to the pixels PX in the same row.

The first voltage line VL1 may be provided in plurality The plurality of first voltage lines VL1 may extend in the first direction DR1 and may be connected to the pixels PX in the same column. The plurality of first voltage lines VL1 may be shared by the pixels PX adjacent to each other in the second direction DR2.

The second voltage line VL2 may be provided in a plurality. The plurality of second voltage lines VL2 may extend in the first direction DR1 and may be connected to the pixels PX in the same column. The plurality of second voltage lines VL2 may be shared by the pixels PX adjacent to each other in the second direction DR2.

The first scan lines SL1_1 through SL1_m may be configured to transmit first scan signals GW_1 through GW_m output from the gate driver 120 to the pixels PX in the same row, respectively. The second scan lines SL2_1 through SL2_m may be configured to transmit second scan signals GI_1 through GI_m output from the gate driver 120 to the pixels PX in the same row, respectively, and the second scan lines SL2_2 through SL2_m+1 may be configured to transmit third scan signals GB_1 through GB_m output from the gate driver 120 to the pixels PX in the same row, respectively. The second scan signal GI_i and the third scan signal GB_i−1 may be the same signal transmitted through the second scan line SL2_i.

The emission control lines EML_1 through EML_m may be configured to transmit emission control signals EM_1 through EM_m output from the gate driver 120 to the pixels PX in the same row, respectively. The data lines DL_1 through DL_n may be configured to transmit data voltages Dm_1 through Dm_n output from the data driver 130 to the pixels PX in the same column, respectively. The pixel PXij in the $i^{th}$ row and the $j^{th}$ column may receive the first- through-third scan signals GW_i, GI_i, and GB_i, the data voltage Dm_j, and the emission control signal EM_i.

Figure 3:
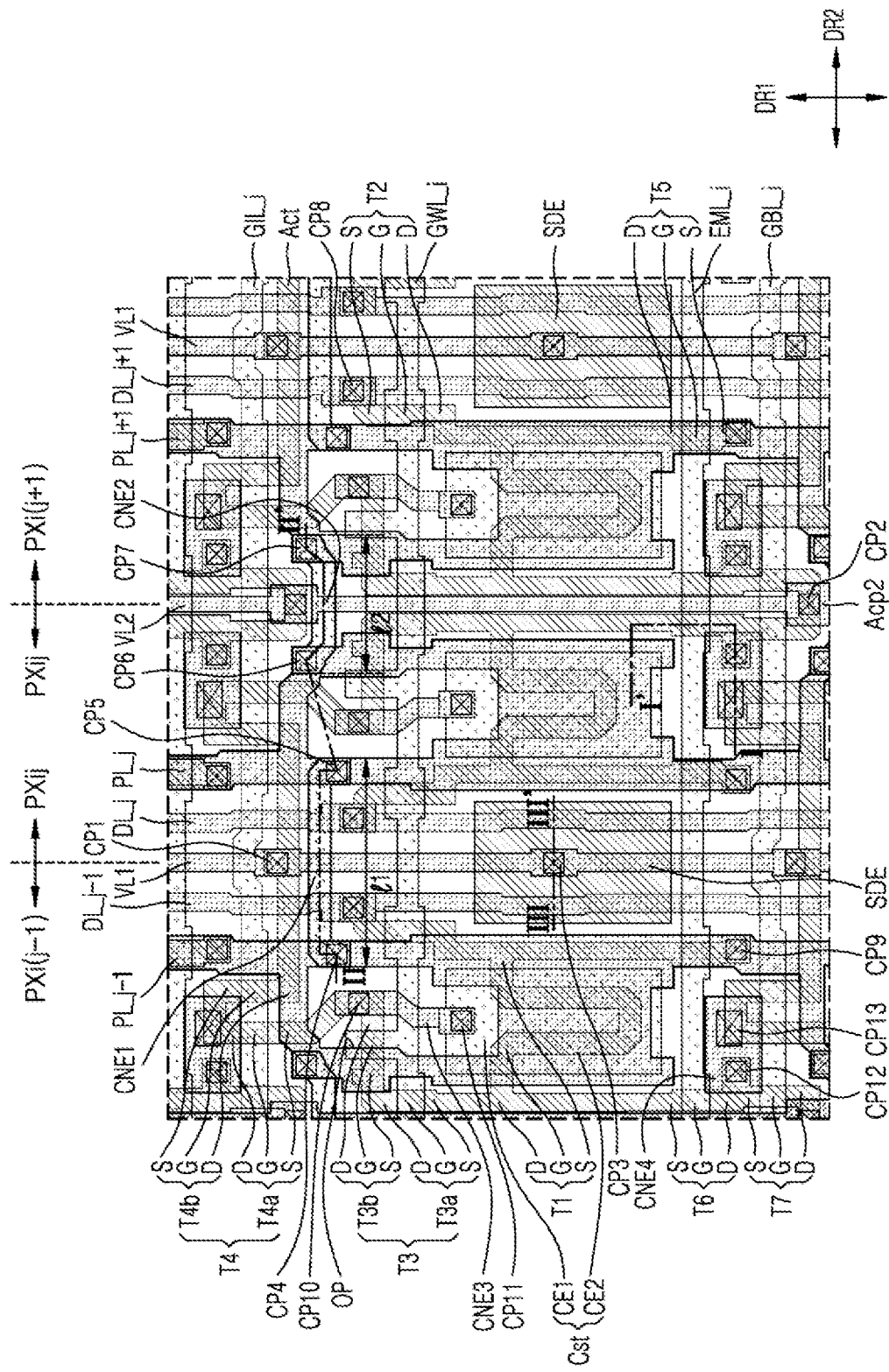
FIG. 3 is a schematic plan view of a plurality of pixels according to an embodiment.
Figure 8:
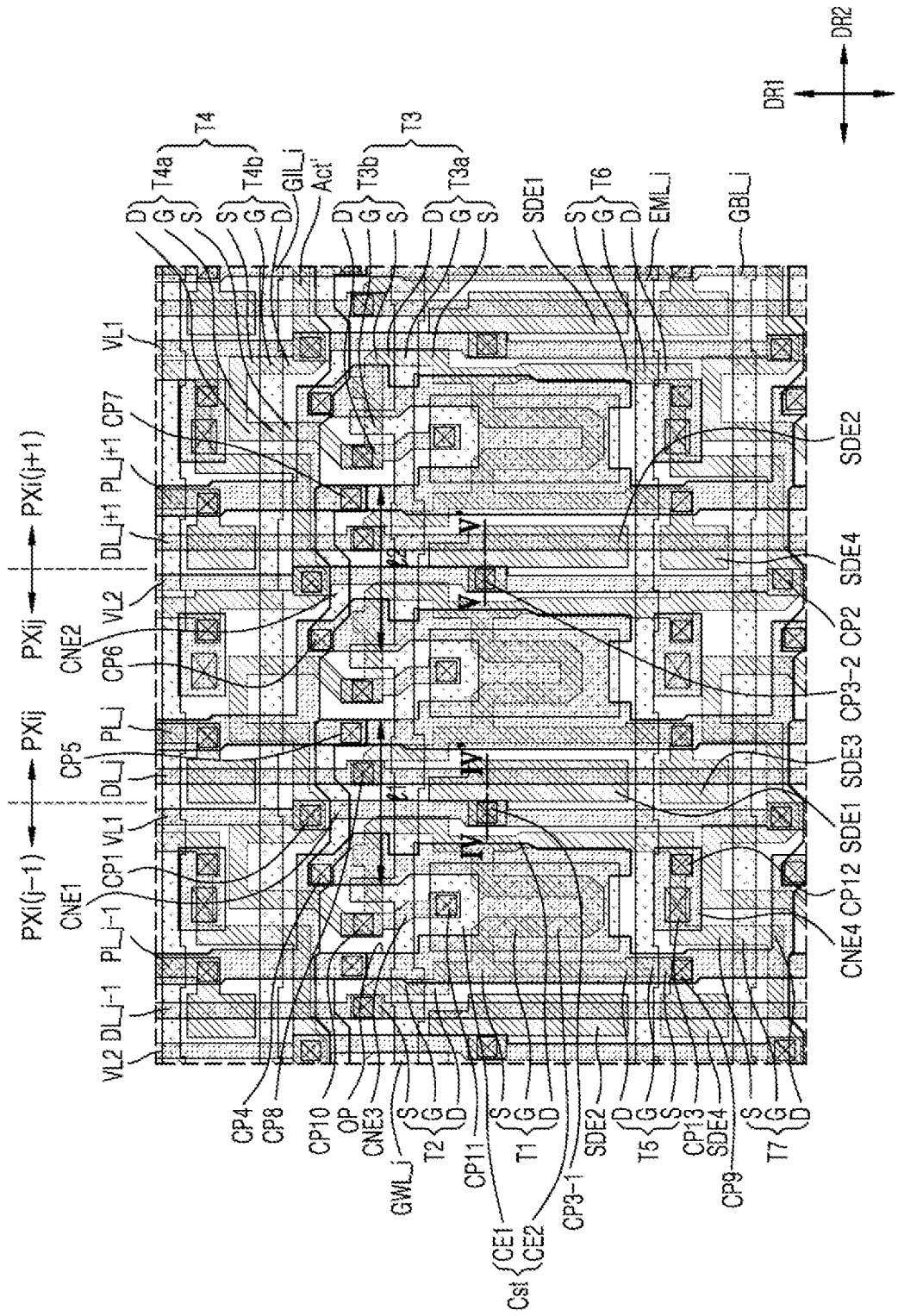
FIG. 8 is a schematic plan view of a plurality of pixels according to an embodiment.

Each of the power lines PL_1 through PL_n may be configured to transmit a first driving voltage ELVDD output from the voltage generator 150 to the pixels PX in the same column. As illustrated in FIGS. 3 and 8 to be described below, the power lines PL_1 through PL_n may be connected to each other through connection electrodes.

The first voltage line VL1 may be configured to transmit a first initialization voltage VINT1 output from the voltage generator 150 to the pixels PX. The second voltage line VL2 may be configured to transmit a second initialization voltage VINT2 output from the voltage generator 150 to the pixels PX.

The pixel PXij may include a light-emitting device and a driving transistor configured to control a magnitude of a current flowing to the light-emitting device according to the data voltage Dm_j. The data voltage Dm_j may be output from the data driver 130 and may be received by the pixel PXij through the data line DL_j. The light-emitting device may include, for example, an organic light-emitting diode. The light-emitting device may emit light by a luminance corresponding to a magnitude of the current received from the driving transistor, so that the pixel PXij may represent a gray scale corresponding to the data voltage Dm_j. The pixels PX may correspond to portions of unit pixels configured to represent a full color, for example, sub-pixels. The pixel PXij may further include at least one switching transistor and at least one capacitor. The pixel PXij is to be described in more detail below.

The voltage generator 150 may generate voltages required for driving the pixel PXij. For example, the voltage generator 150 may generate the first driving voltage ELVDD, the second driving voltage ELVSS, the first initialization voltage VINT1, and the second initialization voltage VINT2. A level of the first driving voltage ELVDD may be higher than a level of the second driving voltage ELVSS. A level of the second initialization voltage VINT2 may be higher than a level of the first initialization voltage VINT1. The level of the second initialization voltage VINT2 may be higher than the level of the second driving voltage ELVSS. A difference between the second initialization voltage VINT2 and the second driving voltage ELVSS may be less than a threshold voltage required for emission of the light-emitting device of the pixel PX.

Although not illustrated in FIG. 1, the voltage generator 150 may generate a first gate voltage VGH and a second gate voltage VGL for controlling the at least one switching transistor of the pixel PXij and provide the first gate voltage VGH and the second gate voltage VGL to the gate driver 120. When the first gate voltage VGH is applied to a gate of the switching transistor, the switching transistor may be turned off, and when the second gate voltage VGL is applied to the gate of the switching transistor, the switching transistor may be turned on. The first gate voltage VGH may be referred to as a turn-off voltage, and the second gate voltage VGL may be referred to as a turn-on voltage. The switching transistors of the pixel PXij may include p-type metal-oxide-semiconductor field-effect transistors (MOSFETs), and a level of the first gate voltage VGH may be higher than a level of the second gate voltage VGL. Although not shown in FIG. 1, the voltage generator 150 may generate gamma reference voltages and provide the gamma reference voltages to the data driver 130.

The timing controller 140 may control operation timings of the gate driver 120 and the data driver 130 to control the display 110. The pixels PX of the display 110 may display an image corresponding to image source data RGB of one frame by receiving a new data voltage Dm for each frame period and emitting light by a luminance corresponding to the data voltage Dm.

According to an embodiment, one frame period may include a gate initialization period, a data write and anode initialization period, and an emission period. During the gate initialization period, the first initialization voltage VINT1 may be applied to the pixels PX in synchronization with the second scan signal GI. During the data write and anode initialization period, the data voltage Dm may be provided to the pixels PX in synchronization with the first scan signal GW, and the second initialization voltage VINT2 may be applied to the pixels PX in synchronization with the third scan signal GB. During the emission period, the pixels PX of the display 110 may emit light.

The timing controller 140 may receive the image source data RGB and a control signal CONT from the outside. The timing controller 140 may convert the image source data RGB into image data DATA according to the characteristics, etc. of the display 110 and the pixels PX. The timing controller 140 may provide the image data DATA to the data driver 130.

The control signal CONT may include a vertical synchronization signal Vsync, a horizontal synchronization signal Hsync, a data enable signal DE, a clock signal CLK, etc. The timing controller 140 may control operation timings of the gate driver 120 and the data driver 130 by using the control signal CONT. The timing controller 140 may determine a frame period by counting the data enable signals DE of a horizontal scanning period. In this case, the vertical synchronization signal Vsync and the horizontal synchronization signal Hsync provided from the outside may be omitted. The image source data RGB may include luminance information of the pixels PX. A luminance may have a predetermined number, for example, $1024(=2^{10})$, $256(=2^8)$, or $64(=2^6)$ gray scales.

The timing controller 140 may generate control signals including a gate timing control signal GDC for controlling an operation timing of the gate driver 120 and a data timing control signal DDC for controlling an operation timing of the data driver 130.

The gate timing control signal GDC may include a gate start pulse (GSP) signal, a gate shift clock (GSC) signal, a gate output enable (GOE) signal, etc. The GSP signal may be supplied to the gate driver 120 configured to generate a first scan signal at a starting time point of a scan period. The GSC signal is a clock signal commonly input to the gate driver 120 and configured to shift the GSP signal. The GOE signal may control an output of the gate driver 120.

The data timing control signal DDC may include a source start pulse (SSP) signal, a source sampling clock (SSC) signal, a source output enable (SOE) signal, etc. The SSP signal may control a starting time point of data sampling of the data driver 130 and may be provided to the data driver 130 at the starting time point of the scan period. The SSC signal is a clock signal for controlling a data sampling operation in the data driver 130 based on a rising edge or a falling edge thereof. The SOE signal may control an output of the data driver 130. The SSP signal provided to the data driver 130 may be omitted depending on a data transmission method.

The gate driver 120 may sequentially generate the first scan signals GW_1 through GW_m, the second scan signals GI_1 through GI_m, and the third scan signals GB_1 through GB_m in response to the gate timing control signal GDC provided from the timing controller 140 by using the first and second gate voltages VGH and VGL provided from the voltage generator 150.

The data driver 130 may convert the image data DATA provided from the timing controller 140 into data of a parallel data system by sampling and latching the image data DATA in response to the data timing control signal DDC supplied from the timing controller 140. When the data driver 130 converts the image data DATA into the data of the parallel data system, the data driver 130 may convert the image data DATA into a gamma reference voltage, and then, into a data voltage of an analog form. The data driver 130 may provide the data voltages Dm_1 through Dm_n to the pixels PX through the data lines DL_1 through DL_n. The pixels PX may receive the data voltages Dm_1 through Dm_n in response to the first scan signals GW_1 through GW_m.

Figure 2:
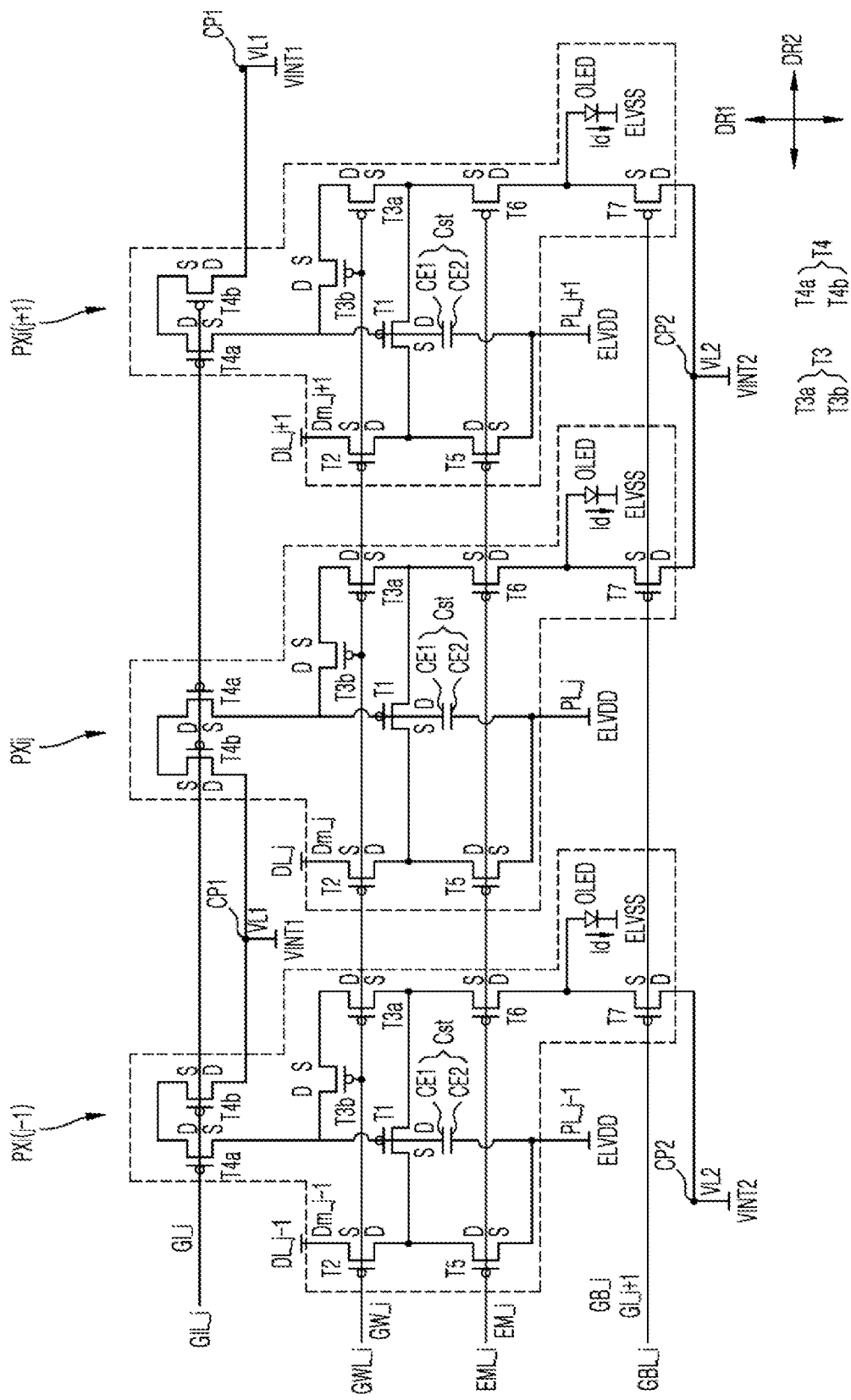
FIG. 2 is an equivalent circuit diagram of each of a plurality of pixels according to an embodiment.

FIG. 2 is an equivalent circuit diagram of each of a plurality of pixels PX according to an embodiment, and FIG. 3 is a schematic plan view of the plurality of pixels PX according to an embodiment.

Referring to FIGS. 2 and 3, a display apparatus may include the pixels PX, such as a pixel PXi(j−1) (hereinafter, referred to as a first pixel) arranged in an $i^{th}$ row and a j−1th column, a pixel PXij (hereinafter, referred to as a second pixel) arranged in the $i^{th}$ row and a $j^{th}$ column, and a pixel PXi(j+1) (hereinafter, referred to as a third pixel) arranged in the $i^{th}$ row and a j+1th column. The pixels PX may be arranged in a first direction (eg., a column direction) DR1 and a second direction (eg., a row direction) DR2. For example, the pixels PX may be arranged in a matrix form.

Because the first pixel PXi(j−1), the second pixel PXij, and the third pixel PXi(j+1) are arranged in the same row, the first pixel PXi(j−1), the second pixel PXij, and the third pixel PXi(j+1) may be connected to the same first-through-third scan lines GWL_i, GIL_i, and GBL_i and the same emission control line EML_i. The first pixel PXi(j−1), the second pixel PXij, and the third pixel PXi(j+1) may be sequentially arranged and adjacent to each other in the second direction DR2.

The first pixel PXi(j−1) may be connected to the first-through-third scan lines GWL_i, GIL_i, and GBL_i respectively configured to transmit first-through-third scan signals GW GI_i, and GB_i, a first data line DL_j−1 configured to transmit a first data voltage Dm_j−1, and the emission control line EML_i configured to transmit an emission control signal EM_i. The first pixel PXi(j−1) may be connected to a first power line PL_j−1 configured to transmit a first driving voltage ELVDD, a first voltage line VL1 configured to transmit a first initialization voltage VINT1, and a second voltage line VL2 configured to transmit a second initialization voltage VINT2. The first pixel PXi(j−1) may be connected to a common electrode to which a second driving voltage ELVSS is applied.

The first scan line GWL_i may correspond to the first scan line SL1_i of FIG. 1, the second scan line GIL_i may correspond to the second scan line SL2_i of FIG. 1, and the third scan line GBL_i may correspond to the second scan line SL2_i+1 of FIG. 1.

The second pixel PXij may be connected to the first-through-third scan lines GWL_i, GIL_i, and GBL_i respectively configured to transmit the first-through-third scan signals GW GI_i, and GB_i, a second data line DL_j configured to transmit a second data voltage Dm_j, and the emission control line EML_i configured to transmit the emission control signal EM_i. The second pixel PXij may be connected to a second power line PL_j configured to transmit the first driving voltage ELVDD, the first voltage line VL1 configured to transmit the first initialization voltage VINT1, and the second voltage line VL2 configured to transmit the second initialization voltage VINT2. The second pixel PXij may be connected to the common electrode to which the second driving voltage ELVSS is applied. The second pixel PXij may correspond to the pixel PXij of FIG. 1.

The third pixel PXi(j+1) may be connected to the first-through-third scan lines GWL_i, GIL_i, and GBL_i respectively configured to transmit the first-through-third scan signals GW GI_i, and GB_i, a third data line DL_j+1 configured to transmit a third data voltage Dm_j+1, and the emission control line EML_i configured to transmit the emission control signal EM_i. The third pixel PXi(j+1) may be connected to a third power line PL_j+1 configured to transmit the first driving voltage ELVDD, the first voltage line VL1 configured to transmit the first initialization voltage VINT1, and the second voltage line VL2 configured to transmit the second initialization voltage VINT2. The third pixel PXi(j+1) may be connected to the common electrode to which the second driving voltage ELVSS is applied.

According to an embodiment, as illustrated in FIGS. 2 and 3, the first pixel PXi(j−1) and the second pixel PXij may be connected to the first voltage line VL1 through a first contact plug CP1, and the second pixel PXij and the third pixel PXi(j+1) may be connected to the second voltage line VL2 through a second contact plug CP2. In other words, the first pixel PXi(j−1) and the second pixel PXij may receive the first initialization voltage VINT1 through the first contact plug CP1, and the second pixel PXij and the third pixel PXi(j+1) may receive the second initialization voltage VINT2 through the second contact plug CP2. Yet in other words, the first pixel PXi(j−1) and the second pixel PXij may share the first contact plug CP1, and the second pixel PXij and the third pixel PXi(j+1) may share the second contact plug CP2. Still in other words, the first pixel PXi(j−1) and the second pixel PXij may share the first voltage line VL1, and the second pixel PXij and the third pixel PXi(j+1) may share the second voltage line VL2.

Based on the second pixel PXij, the second pixel PXij may share the first contact plug CP1 with the first pixel PXi(j−1) arranged in a previous column and may share the second contact plug CP2 with the third pixel PXi(j+1) arranged in a next column. Although not illustrated in FIG. 2, the first pixel PXi(j−1) may share the second contact plug CP2 with a pixel arranged in a previous column, like the second pixel PXij and the third pixel PXi(j+1) share the second contact plug CP2. Based on the first pixel PXi(j−1), the first pixel PXi(j−1) may share the second contact plug CP2 with the pixel arranged in the previous column and may share the first contact plug CP1 with the second pixel PXij arranged in a next column. The third pixel PXi(j+1) may share the first contact plug CP1 with a pixel arranged in a next column, like the first pixel PXi(j−1) and the second pixel PXij share the first contact plug CP1. Based on the third pixel PXi(j+1), the third pixel PXi(j+1) may share the second contact plug CP2 with the second pixel PXij arranged in a previous column and may share the first contact plug CP1 with the pixel arranged in the next column. As described above, the pixels arranged in the ith row may be connected to each other through the first contact plugs CP1 and the second contact plugs CP2 alternately arranged in the second direction DR2.

The first contact plug CP1 and the second contact plug CP2 may correspond to a portion of a conductive layer. The first contact plug CP1 and the second contact plug CP2 may correspond to a portion of the conductive layer, the portion being buried in a contact hole formed in an insulating layer. For example, the first contact plug CP1 may correspond to a portion of the first voltage line VL1, the portion being buried in the contact hole formed in the insulating layer, and the second contact plug CP2 may correspond to a portion of the second voltage line VL2, the portion being buried in the contact hole formed in the insulating layer. The first contact plug CP1 and the first voltage line VL1 may be integral with each other, and the second contact plug CP2 and the second voltage line VL2 may be integral with each other.

According to an embodiment, the first voltage line VL1 and the second voltage line VL2 each may be provided in plurality. The first voltage lines VL1 and the second voltage lines VL2 may be alternately arranged with each other in the second direction DR2. In other words, as illustrated in FIG. 3, the number of pixels arranged in the ith row between first voltage lines VL1 adjacent to each other in the second direction DR2 from among the plurality of first voltage lines VL1 may be 2. The number of pixels arranged in the ith row between second voltage lines VL2 adjacent to each other in the second direction DR2 from among the plurality of second voltage lines VL2 may be 2.

As described above, part or all of the pixels PX may share the first contact plug CP1 and/or the second contact plug CP2 and may receive the first initialization voltage VINT1 and/or the second initialization voltage VINT2. In this case, the number of first voltage lines VL1 configured to supply the first initialization voltage VINT1 may be less than the number of pixels (or the number of pixel columns) in the second direction DR2. The number of second voltage lines VL2 configured to supply the second initialization voltage VINT2 may be less than the number of pixel columns. Alternatively, the sum of the number of first voltage lines VL1 and the number of second voltage lines VL2 may be less than the number of pixel columns.

According to an embodiment, as illustrated in FIG. 3, a shielding electrode SDE may be arranged between the first pixel PXi(j−1) and the second pixel PXij. The shielding electrode SDE may be connected to the first voltage line VL1 through a third contact plug CP3. The shielding electrode SDE may receive the first initialization voltage VINT1 through the third contact plug CP3.

The first data line DL_j−1 configured to transmit the first data voltage Dm_j−1 to the first pixel PXi(j−1) may at least partially overlap the shielding electrode SDE. Like this, when the shielding electrode SDE to which the first initialization voltage VINT1 is applied at least partially overlaps the first data line DL_j−1, the first data line DL_j−1 may be shielded, and a parasitic capacitance between the first data line DL_j−1 and adjacent electrodes may be blocked. For example, the parasitic capacitance between the first data line DL_j−1 and a first electrode CE1 (corresponding to a gate of a driving transistor) adjacent to the first data line DL_j−1 may be blocked. A change of a driving current Id of a light-emitting device OLED due to a change of a voltage of the first electrode CE1 according to a change of the first data voltage Dm_j−1 may be prevented. That is, crosstalk, which is a change in luminance due to the parasitic capacitance between the first data line DL_j−1 and the first electrode CE1, may be prevented.

The second data line DL_j configured to transmit the second data voltage Dm_j to the second pixel PXij may at least partially overlap the shielding electrode SDE. As described above, when the shielding electrode SDE to which the first initialization voltage VINT1 is applied at least partially overlaps the second data line DL_j, the second data line DL_j may be shielded, and a parasitic capacitance between the second data line DL_j and adjacent electrodes may be blocked.

The shielding electrode SDE may also be arranged between the third pixel PXi(j+1) and a pixel arranged in a next column. The number of pixels arranged in the $i^{th}$ row between the shielding electrodes SDE adjacent to each other in the second direction DR2 may be 2. The third data line DL_j+1 configured to transmit the third data voltage Dm_j+1 to the third pixel PXi(j+1) may at least partially overlap the shielding electrode SDE. As described above, when the shielding electrode SDE to which the first initialization voltage VINT1 is applied at least partially overlaps the third data line DL_j+1, the third data line DL_j+1 may be shielded, and a parasitic capacitance between the third data line DL_j+1 and adjacent electrodes may be blocked.

According to an embodiment, as illustrated in FIG. 3, the first power line PL the second power line PL_j, and the third power line PL_j+1 may be sequentially arranged and apart from each other in the first direction DR1. The first power line PL_j−1, the second power line PL_j, and the third power line PL_j+1 may extend in the second direction DR2. Each of the first power line PL_j−1, the second power line PL_j, and the third power line PL_j+1 may have an opening OP exposing at least a portion of an insulating layer arranged below each of the first power line PL_j−1, the second power line PL_j, and the third power line PL_j+1.

The first voltage line VL1 extending in the second direction DR2 may be arranged between the first power line PL_j−1 and the second power line PL_j, and the second voltage line VL2 extending in the second direction DR2 may be arranged between the second power line PL_j and the third power line PL_j+1. Here, the first power line PL_j−1 and the second power line PL_j may be symmetrical with each other with respect to the first voltage line VL1. The second power line PL_j and the third power line PL_j+1 may be symmetrical with each other with respect to the second voltage line VL2. The first power line PL_j−1 and the third power line PL_j+1 may have the same plan shape.

FIG. 3 illustrates that the first power line PL_j−1 and the second power line PL are symmetrical with each other with respect to the first voltage line VL1, and the second power line PL_j and the third power line PL_j+1 are symmetrical with each other with respect to the second voltage line VL2. However, according to another embodiment, the first power line PL_j−1, the second power line PL_j, and the third power line PL_j+1 may have the same plan shape. This aspect will be described below with reference to FIG. 8.

According to an embodiment, the first power line PL_j−1 and the second power line PL_j may be connected to each other through a first connection electrode CNE1. The first power line PL_j−1 may be connected to the first connection electrode CNE1 through a fourth contact plug CP4, and the second power line PL_j may be connected to the first connection electrode CNE1 through a fifth contact plug CP5. The second power line PL_j and the third power line PL_j+1 may be connected to each other through a second connection electrode CNE2. The second power line PL_j may be connected to the second connection electrode CNE2 through a sixth contact plug CP6, and the third power line PL_j+1 may be connected to the second connection electrode CNE2 through a seventh contact plug CP7. As described above, because the power lines apart from each other are connected to each other via the connection electrodes, the lines to which the first driving voltage ELVDD is applied may have a mesh structure.

According to an embodiment, the first connection electrode CNE1 and the second connection electrode CNE2 may extend in the second direction DR2. A first length $\ell 1$ of the first connection electrode CNE1 in the second direction DR2 may be greater than a second length $\ell 2$ of the second connection electrode CNE2 in the second direction DR2. According to another embodiment, the first length $\ell 1$ of the first connection electrode CNE1 may be substantially the same as the second length $\ell 2$ of the second connection electrode CNE2. This aspect will be described below with reference to FIG. 8.

The first connection electrode CNE1 and the second connection electrode CNE2 may be arranged between the first scan line GWL_i and the second scan line GIL_i.

The first connection electrode CNE1 and the second connection electrode CNE2 each may be provided in plurality. The plurality of first connection electrodes CNE1 and the plurality of second connection electrodes CNE2 may be alternately arranged with each other in the second direction DR2.

Hereinafter, devices included in the first pixel PXi(j−1), the second pixel PXij, and the third pixel PXi(j+1) are described. The equivalent circuit diagram of each of the first pixel PXi(j−1) and the third pixel PXi(j+1) may be the same as the equivalent circuit diagram of the second pixel PXij, and thus, descriptions are given based on the second pixel PXij.

The second pixel PXij may include a light-emitting device OLED, first through seventh transistors T1 through T7, and a storage capacitor Cst. The light-emitting device OLED may include an organic light-emitting diode having an anode and a cathode. The cathode may be a common electrode to which the second driving voltage ELVSS is applied.

The first transistor T1 may be a driving transistor, a magnitude of a drain current of which is determined according to a gate-source voltage, and the second through seventh transistors T2 through T7 may be switching transistors, which are turned on/off according to the gate-source voltage, in reality, a gate voltage. The third transistor T3 may include a first compensation transistor T3a and a second compensation transistor T3b connected with each other in series. The fourth transistor T4 may include a first gate initialization transistor T4a and a second gate initialization transistor T4b connected with each other in series.

The first transistor T1 may be referred to as a driving transistor, the second transistor T2 may be referred to as a scan transistor, the third transistor T3 may be referred to as a compensation transistor, the fourth transistor T4 may be referred to as a gate initialization transistor, the fifth transistor T5 may be referred to as a first emission control transistor, the sixth transistor T6 may be referred to as a second emission control transistor, and the seventh transistor T7 may be referred to as an anode initialization transistor.

The storage capacitor Cst may be connected between the second power line PL and a gate of the driving transistor T1.

The storage capacitor Cst may have a second electrode CE2 connected to the second power line PL_j and the first electrode CE1 connected to the gate of the driving transistor T1. For example, as illustrated in FIG. 3, the first electrode CE1 may correspond to the gate of the driving transistor T1, and the second electrode CE2 may correspond to at least a portion of the second power line PL_j overlapping the first electrode CE1.

The driving transistor T1 may be configured to control a magnitude of a current Id flowing from the second power line PL_j to the light-emitting device OLED according to a gate-source voltage. The driving transistor T1 may have the gate connected to the first electrode CE1 of the storage capacitor Cst, a source connected to the second power line PL_j through the first emission control transistor T5, and a drain connected to the light-emitting device OLED through the second emission control transistor T6.

The driving transistor T1 may be configured to output the driving current Id to the light-emitting device OLED according to the gate-source voltage. The magnitude of the driving current Id may be determined based on a difference between the gate-source voltage of the driving transistor T1 and a threshold voltage. The light-emitting device OLED may receive the driving current Id from the driving transistor T1 and emit light by a luminance according to the magnitude of the driving current Id.

The scan transistor T2 may be configured to transmit the second data voltage Dm_j to the source of the driving transistor T1 in response to the first scan signal GW_i. The scan transistor T2 may have a gate connected to the first scan line GWL_i, a source connected to the second data line DL_j, and a drain connected to the source of the driving transistor T1. For example, as illustrated in FIG. 3, the source of the scan transistor T2 may be connected to the second data line DL_j through an eighth contact plug CP8.

The first and second compensation transistors T3a and T3b may be connected in series between the drain and the gate of the driving transistor T1 and may be configured to connect the drain to the gate of the driving transistor T1 in response to the first scan signal GW_i. The first compensation transistor T3a may have a gate connected to the first scan line GWL_i, a source connected to the drain of the driving transistor T1, and a drain connected to a source of the second compensation transistor T3b. The second compensation transistor T3b may have a gate connected to the first scan line GWL_i, the source connected to the drain of the first compensation transistor T3a, and a drain connected to the gate of the driving transistor T1. For example, as illustrated in FIG. 3, the drain of the second compensation transistor T3b may be connected to the gate of the driving transistor T1 through a third connection electrode CNE3, a tenth contact plug CP10, and an eleventh contact plug CP11. The third connection electrode CNE3 may be arranged in an opening OP of the second power line PL_j.

FIGS. 2 and 3 illustrate that the compensation transistor T3 includes two transistors serially connected with each other. However, the compensation transistor T3 may include one transistor. As another example, the compensation transistor T3 may include three or more transistors serially connected with one another.

The gate initialization transistor T4 may be configured to apply the first initialization voltage VINT1 to the gate of the driving transistor T1 in response to the second scan signal GI_i. The gate initialization transistor T4 may have a gate connected to the second scan line GIL_i, a source connected to the gate of the driving transistor T1, and a drain connected to the first voltage line VL1.

As described above, the first pixel PXi(j−1) and the second pixel PXij may share the first contact plug CP1 connected to the first voltage line VL1. When the gate initialization transistor T4 of each of the first pixel PXi(j−1) and the second pixel PXij is turned on in response to the second scan signal GI_i, the first initialization voltage VINT1 transmitted through the first contact plug CP1 may be applied to the gate of the driving transistor T1 of each of the first pixel PXi(j−1) and the second pixel PXij.

As illustrated in FIGS. 2 and 3, the gate initialization transistor T4 may include a first gate initialization transistor T4a and a second gate initialization transistor T4b connected with each other in series between the gate of the driving transistor T1 and the first voltage line VL1. The first gate initialization transistor T4a may have a gate connected to the second scan line GIL_i, a source connected to the gate of the driving transistor T1, and a drain connected to a source of the second gate initialization transistor T4b. The second gate initialization transistor T4b may have a gate connected to the second scan line GIL_i, the source connected to the drain of the first gate initialization transistor T4a, and a drain connected to the first voltage line VL1.

FIGS. 2 and 3 illustrate that the gate initialization transistor T4 includes two transistors connected with each other in series. However, the gate initialization transistor T4 may include three or more transistors connected with one another in series. As another example, the gate initialization transistor T4 may include one transistor.

The anode initialization transistor T7 may be configured to apply the second initialization voltage VINT2 to the anode of the light-emitting device OLED in response to the third scan signal GB_i. The anode initialization transistor T7 may have a gate connected to the third scan line GBL_i, a source connected to the anode of the light-emitting device OLED, and a drain connected to the second voltage line VL2.

As described above, the second pixel PXij and the third pixel PXi(j+1) may share the second contact plug CP2 connected to the second voltage line VL2. When the anode initialization transistor T7 of each of the second pixel PXij and the third pixel PXi(j+1) is turned on in response to the third scan signal GB_i, the second initialization voltage VINT2 transmitted through the second contact plug CP2 may be applied to the anode of the light-emitting device OLED of each of the second pixel PXij and the third pixel PXi(j+1).

The first emission control transistor T5 may be configured to connect the second power line PL_j with the source of the driving transistor T1 in response to the emission control signal EM_i. The first emission control transistor T5 may have a gate connected to the emission control line EML_i, a source connected to the second power line PL_j, and a drain connected to the source of the driving transistor T1. For example, as illustrated in FIG. 3, the source of the first emission control transistor T5 may be connected to the second power line PL_j through a ninth contact plug CP9.

The second emission control transistor T6 may connect the drain of the driving transistor T1 with the anode of the light-emitting device OLED in response to the emission control signal EM_i. The second emission control transistor T6 may have a gate connected to the emission control line EML_i, a source connected to the drain of the driving transistor T1, and a drain connected to the anode of the light-emitting device OLED. For example, as illustrated in FIG. 3, the drain of the second emission control transistor T6 may be connected to the anode of the light-emitting device OLED through a fourth connection electrode CNE4, a twelfth contact plug CP12, and a thirteenth contact plug CP13.

The second scan signal GI_i may be substantially synchronized with the first scan signal GW_i−1 of a previous row. The third scan signal GB_i may be substantially synchronized with the first scan signal GW_i. As another example, the third scan signal GB_i may be substantially synchronized with the first scan signal GW_i+1 of a next row.

Hereinafter, specific operations of a pixel of an organic light-emitting display apparatus according to an embodiment are described in detail.

First, when the emission control signal EM_i of a high level is received, the first emission control transistor T5 and the second emission control transistor T6 may be turned off, the driving transistor T1 may stop outputting the driving current Id, and the light-emitting device OLED may stop emitting light.

Thereafter, during a gate initialization period during which the second scan signal GI_i of a low level is received, the gate initialization transistor T4 may be turned on, and the first initialization voltage VINT1 may be applied to the gate of the driving transistor T1, that is, the first electrode CE1 of the storage capacitor Cst. A difference ELVDD-VINT1 between the first driving voltage ELVDD and the first initialization voltage VINT1 may be stored in the storage capacitor Cst.

Thereafter, during a data write period during which the first scan signal GW_i of a low level is received, the scan transistor T2 and the compensation transistor T3 may be turned on, and the second data voltage Dm_j may be received by the source of the driving transistor T1. The driving transistor T1 may be diode-connected by the compensation transistor T3 and may be biased in a forward direction. A gate voltage of the driving transistor T1 may rise at the first initialization voltage VINT1. When the gate voltage of the driving transistor T1 becomes equal to a data compensation voltage Dm_j−1Vthl obtained by subtracting a threshold voltage Vth of the driving transistor T1 from the second data voltage Dm_j, the driving transistor T1 may be turned off, and the gate voltage of the driving transistor T1 may stop rising. Thus, a difference ELVDD-Dm_j+1Vthl between the first driving voltage ELVDD and the data compensation voltage Dm_j−1Vthl may be stored in the storage capacitor Cst.

Also, during an anode initialization period during which the third scan signal GB_i of a low level is received, the anode initialization transistor T7 may be turned on, and the second initialization voltage VINT2 may be applied to the anode of the light-emitting device OLED. By completely making the light-emitting device OLED not emit light by applying the second initialization voltage VINT2 to the anode of the light-emitting device OLED, the phenomenon in which the light-emitting device OLED minutely emits light in correspondence to a black gray scale in a next frame may be removed.

A level of the second initialization voltage VINT2 may be higher than a level of the first initialization voltage VINT1 and may be lower than a voltage level as high as a threshold voltage of the light-emitting device OLED at the second driving voltage ELVSS. The light-emitting device OLED may have a relatively large size, and thus, may have a relatively large capacitance. Also, the level of the first initialization voltage VINT1 is very low, and thus, the light-emitting device OLED may start emitting light after a significant delay of time in a next frame. However, according to the present embodiment, by initializing the anode of the light-emitting device OLED by using the second initialization voltage VINT2 having a higher level than the first initialization voltage VINT1, the light-emitting device OLED may start emitting light within a short period of time in the next frame. That is, the emission delay problem may be solved.

The first scan signal GW_i and the third scan signal GB_i may be substantially synchronized with each other, and in this case, the data write period and the anode initialization period may be the same period.

Thereafter, when the emission control signal EM_i of a low level is received, the first emission control transistor T5 and the second emission control transistor T6 may be turned on, the driving transistor T1 may output the driving current Id corresponding to the voltage stored in the storage capacitor Cst, that is, a voltage ELVDD-Dm_j obtained by subtracting the threshold voltage 1Vthl of the driving transistor T1 from the source-gate voltage ELVDD-Dm_j+1Vthl of the driving transistor T1, and the light-emitting device OLED may emit light by a luminance corresponding to a magnitude of the driving current Id.

Figure 4:
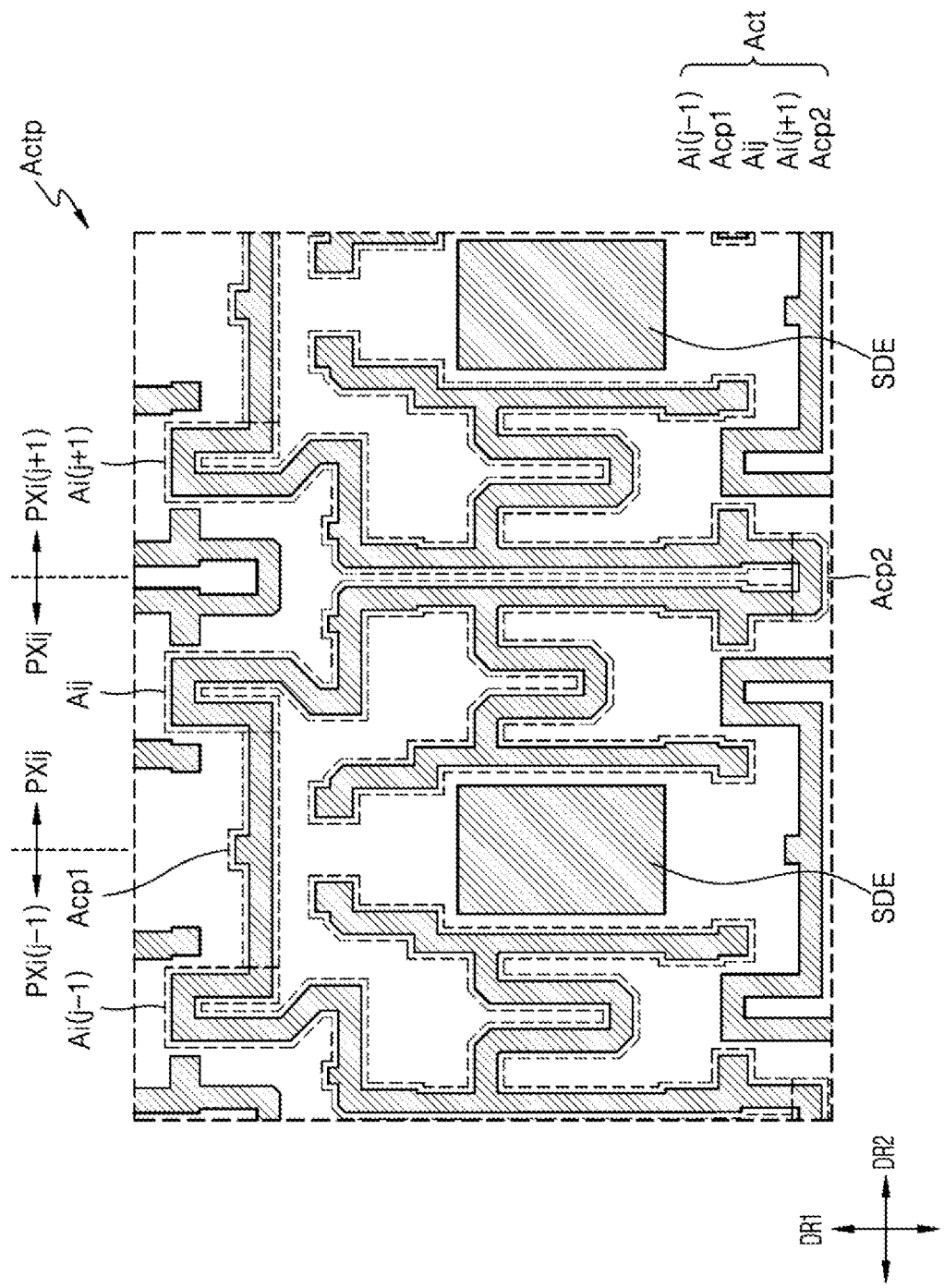
FIG. 4 is a view of a semiconductor material layer of FIG. 3.

FIG. 4 is a view of a semiconductor material layer Actp of FIG. 3.

Referring to FIG. 4, the semiconductor material layer Actp may include a semiconductor pattern Act and the shielding electrode SDE.

The semiconductor pattern Act may continually extend in a second direction DR2. The semiconductor pattern Act may extend in the second direction DR2 without a break and may be integrally formed. Although the semiconductor pattern Act illustrated in FIG. 4 may partially extend in a first direction DR1, the semiconductor pattern Act may generally extend in the second direction DR2. In other words, the semiconductor pattern Act may microscopically include a portion extending in the first direction DR1, but may generally extend in the second direction DR2.

The semiconductor pattern Act may include a plurality of pixel areas Ai(j−1), Aij, and Ai(j+1) and a plurality of first contact areas Acp1 and a plurality of second contact areas Acp2 arranged between the plurality of pixel areas Ai(j−1), Aij, and Ai(j+1).

The plurality of pixel areas Ai(j−1), Aij, and Ai(j+1) may be included in the plurality of pixels PXi(j−1), PXij, and PXi(j+1), respectively. The plurality of first contact areas Acp1 may correspond to the plurality of first contact plugs CP1, respectively, and the plurality of second contact areas Acp2 may correspond to the plurality of second contact plugs CP2, respectively. Alternatively, the plurality of first contact areas Acp1 may directly contact the plurality of first contact plugs CP1, respectively, and the plurality of second contact areas Acp2 may directly contact the plurality of second contact plugs CP2, respectively.

According to an embodiment, the first contact areas Acp1 and the second contact areas Acp2 may be alternately arranged with each other in the second direction DR2.

The first contact area Acp1 may connect the pixel area Ai(j−1) of the first pixel PXi(j−1) with the pixel area Aij of the second pixel PXij, and the second contact area Acp2 may connect the pixel area Aij of the second pixel PXij with the pixel area Ai(j+1) of the third pixel PXi(j+1). As described above with reference to FIG. 2, the first pixel PXi(j−1) may share the second contact plug CP2 with the pixel arranged in the previous column, like the second pixel PXij and the third pixel PXi(j+1) share the second contact plug CP2, and the third pixel PXi(j+1) may share the first contact plug CP1 with the pixel arranged in the next column, like the first pixel PXi(j−1) and the second pixel PXij share the first contact plug CP1. Thus, the pixel area Ai(j−1) of the first pixel PXi(j−1) and a pixel area of the pixel arranged in the previous column may be connected with each other via the second contact area Acp2, and the pixel area Ai(j+1) of the third pixel PXi(j+1) and a pixel area of the pixel arranged in the next column may be connected with each other via the first contact area Acp1.

As a comparative example, the semiconductor pattern may not continually extend in the row direction and may include a plurality of island patterns spaced apart from each other. The island patterns included in the plurality of pixels, respectively, may not be connected with each other. Static electricity may be generated (or introduced) from the outside during processes, etc. sequentially performed after the semiconductor pattern is formed. When the semiconductor pattern includes the island patterns apart from each other, the generated (or introduced) static electricity may be isolated in each of the island patterns. Thus, the semiconductor pattern affected by the static electricity may be damaged, and pixel defects may occur due to the damaged semiconductor pattern.

However, according to an embodiment, when the semiconductor pattern Act continually extends in the second direction DR2, static electricity generated (or introduced) from the outside may not be isolated and may be distributed (or diffused) in the second direction DR2. Accordingly, because the static electricity may not be isolated in the semiconductor pattern Act and may be distributed in the second direction DR2, damage to the semiconductor pattern Act may be prevented.

The shielding electrode SDE may be arranged to be apart from the semiconductor pattern Act. The shielding electrode SDE may be arranged on the same layer as the semiconductor pattern Act. A first initialization voltage VINT1 may be applied to the shielding electrode SDE through the third contact plug CP3, as described above with reference to FIG. 3. The shielding electrode SDE may be arranged between the pixel area Ai(j−1) of the first pixel PXi(j−1) and the pixel area Aij of the second pixel PXij. The shielding electrode SDE may be arranged between the pixel area Ai(j+1) of the third pixel PXi(j+1) and a pixel area of a pixel arranged in a next column with respect to the third pixel PXi(j+1).

FIG. 4 illustrates that the shielding electrode SDE has a square plan shape. However, according to other embodiments of the inventive concepts, the shielding electrode SDE may have a polygonal plan shape, such as a triangular, pentagonal, or hexagonal plan shape; a circular plan shape; an oval plan shape; an amorphous plan shape; or the like.

Figure 5:
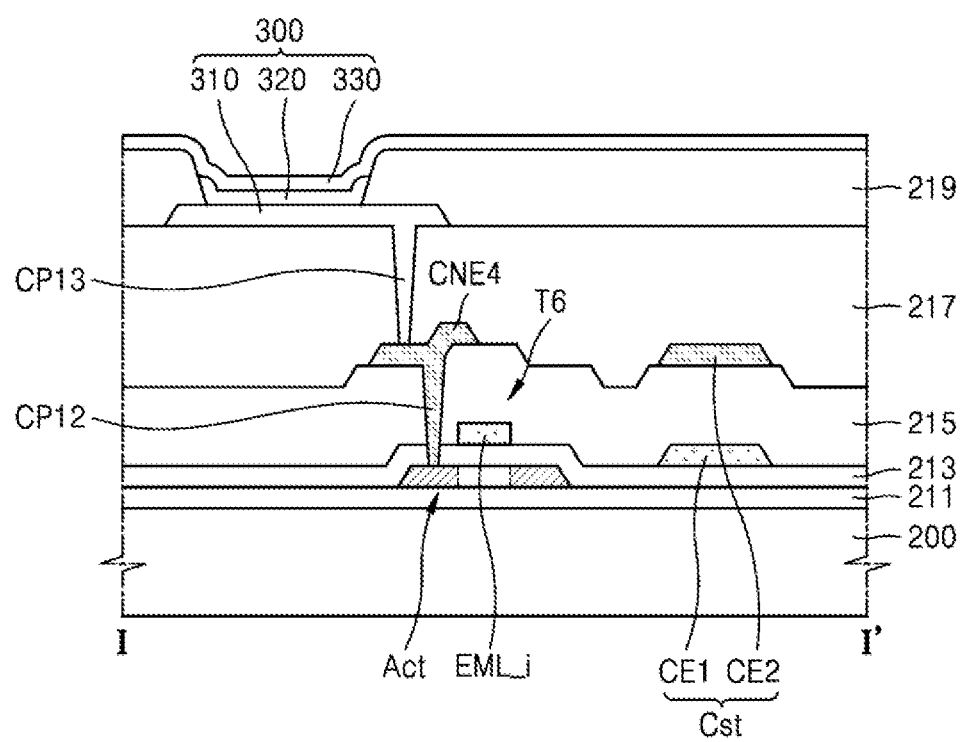
FIG. 5 is an example cross-sectional view of a region of FIG. 3, taken along line I-I'.

FIG. 5 is an example cross-sectional view of a region of FIG. 3, taken along line I-I', and may omit one or more components. Hereinafter, multiple layers stacked in a display apparatus, etc. are described in detail with reference to FIG. 5.

A substrate 200 may include a glass material, a ceramic material, a metal material, or a flexible or bendable material. In the case where the substrate 200 is flexible or bendable, the substrate 200 may include polymer resins, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 200 may have a single-layered or a multi-layered structure of the materials described above, and when the substrate 200 has a multi-layered structure, the substrate 200 may further include an inorganic material. In some embodiments, the substrate 200 may have a structure of an organic material/an inorganic material/an organic material.

A buffer layer 211 may reduce or block the penetration of impurities, moisture, or external materials from below the substrate 200 and may provide a planarized surface to the substrate 200. The buffer layer 211 may include an inorganic material, such as an oxide or a nitride, an organic material, or an organic and inorganic compound and may have a single-layered structure or a multi-layered structure including the inorganic material and the organic material.

A barrier layer (not shown) may further be included between the substrate 200 and the buffer layer 211. The barrier layer may prevent or minimize the penetration of impurities from the substrate 200, etc. into the semiconductor material layer Actp (see FIG. 4) including the semiconductor pattern Act. The barrier layer may include an inorganic material, such as an oxide or a nitride, an organic material, or an organic and inorganic compound and may have a single-layered structure or a multi-layered structure including the inorganic material and the organic material.

The semiconductor material layer Actp including the semiconductor pattern Act may be arranged on the buffer layer 211. The semiconductor material layer Actp may include a single layer or layers. The semiconductor material layer Actp may include amorphous silicon or polysilicon.

According to another embodiment, the semiconductor material layer Actp may include an oxide semiconductor material. The semiconductor material layer Actp may include, for example, an oxide of at least one material selected from the group consisting of In, Ga, Sn, Zr, V, Hf, Cd, Ge, Cr, Ti, Al, Cs, Ce, and Zn.

For example, the semiconductor material layer Actp may include an InSnZnO (ITZO) semiconductor layer, an InGaZnO (IGZO) semiconductor layer, etc. The oxide semiconductor may have a large band gap (about 3.1 eV), a high carrier mobility, and a low leakage current, and thus, even when a driving time is increased, a voltage drop may not be large. Thus, even in a low frequency operation, there may be a less luminance change due to a voltage drop.

The semiconductor pattern Act may include a channel area, a source area, and a drain area arranged at both sides of the channel area. The source area and the drain area may be areas doped with a dopant.

A gate insulating layer 213 may be stacked on the substrate 200 to cover the semiconductor material layer Actp. The gate insulating layer 213 may include $SiO_2$, $SiN_x$, SiON, $Al_2O_3$, $TiO_2$, $Ta_2O_5$, $HfO_2$, $ZnO_2$, or the like.

A first conductive material layer including the emission control line EML_i and the first electrode CE1 may be arranged on the gate insulating layer 213. The first conductive material layer may include a conductive material including Mo, Al, Cu, Ti, or the like and may include layers or a single layer including the materials described above. For example, the first conductive material layer may have a multi-layered structure of Ti/Al/Ti.

The emission control line EML_i may at least partially overlap the semiconductor pattern Act. A portion of the emission control line EML_i, the portion overlapping the semiconductor pattern Act, may be referred to as the gate of the second emission control transistor T6. Although the descriptions are given based on the emission control line EML_i, the descriptions may be likewise applied to the first-through-third scan lines GWL_i, GIL_i, and GBL_i.

According to an embodiment, the storage capacitor Cst may include the first electrode CE1 and the second electrode CE2 and may overlap the driving transistor T1, as illustrated in FIG. 3 described above. For example, the gate of the driving transistor T1 may function as the first electrode CE1 of the storage capacitor Cst. Alternatively, the storage capacitor Cst may not overlap the driving transistor T1 and may be separately provided.

An interlayer insulating layer 215 may be arranged on the gate insulating layer 213 to cover the first conductive material layer including the emission control line EML_i and the first electrode CE1. The interlayer insulating layer 215 may include $SiO_2$, $SiN_x$, SiON, $Al_2O_3$, $TiO_2$, $Ta_2O_5$, $HfO_2$, $ZnO_2$, or the like.

A second conductive material layer including the fourth connection electrode CNE4 and the second electrode CE2 may be arranged on the interlayer insulating layer 215. The second conductive material layer may include a conductive material including Mo, Al, Cu, Ti, or the like and may include layers or a single layer including the materials described above. For example, the second conductive material layer may have a multi-layered structure of Ti/Al/Ti.

The second electrode CE2 of the storage capacitor Cst may overlap the first electrode CE1 with the interlayer insulating layer 215 therebetween and may form a capacitance. In this case, the interlayer insulating layer 215 may function as a dielectric layer of the storage capacitor Cst.

The fourth connection electrode CNE4 may be connected to the semiconductor pattern Act through a contact hole formed in the gate insulating layer 213 and the interlayer insulating layer 215. A portion of the fourth connection electrode CNE4 may be buried in the contact hole, and the portion of the fourth connection electrode CNE4, the portion being buried in the contact hole, may be referred to as the twelfth contact plug CP12. In other words, the fourth connection electrode CNE4 and the twelfth contact plug CP12 may be integral with each other.

The second conductive material layer may be covered by an inorganic protection layer (not shown). The inorganic protection layer may include a single layer or layers including $SiN_x$ and $SiO_x$. The inorganic protection layer may be provided to cover and protect some lines arranged on the interlayer insulating layer 215.

A planarization layer 217 may be arranged on the interlayer insulating layer 215, and a light-emitting device 300 may be arranged on the planarization layer 217.

The planarization layer 217 may include a single layer or layers including an organic material and may provide a flat upper surface. The planarization layer 217 may include benzocyclobutene (BCB), PI, hexamethyldisiloxane (HMDSO), polymethylmethacrylate (PMMA), or a general-purpose polymer, such as polystyrene (PS), a polymer derivate having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The light-emitting device 300 may be arranged on the planarization layer 217. The light-emitting device 300 may include a pixel electrode 310, an intermediate layer 320 including an organic emission layer, and an opposite electrode 330.

The pixel electrode 310 may include a transflective electrode or a reflection electrode. In some embodiments, the pixel electrode 310 may include a reflective layer including Ag, Mg, Al, Pt, Pd, Au, Ni, Nd, Ir, Cr, and a compound thereof and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 310 may include ITO/Ag/ITO.

The pixel electrode 310 may be connected to the fourth connection electrode CNE4 through a contact hole formed in the planarization layer 217. A portion of the pixel electrode 310 may be buried in the contact hole, and the portion of the pixel electrode 310, the portion being buried in the contact hole, may be referred to as the thirteenth contact plug CP13. In other words, the pixel electrode 310 and the thirteenth contact plug CP13 may be integral with each other. The fourth connection electrode CNE4 may be connected to the semiconductor pattern Act, and thus, the pixel electrode 310 may be connected to the second emission control transistor T6 through the fourth connection electrode CNE4.

A pixel-defining layer 219 may be arranged on the planarization layer 217. Also, the pixel-defining layer 219 may increase a distance between an edge of the pixel electrode 310 and the opposite electrode 330 above the pixel electrode 310 so as to prevent arcs, etc. from occurring at the edge of the pixel electrode 310.

The pixel-defining layer 219 may include at least one organic insulating material selected from the group consisting of polyimide, polyamide, acryl resins, BCB, and phenol resins. The pixel-defining layer 219 may include an organic insulating material. Alternatively, the pixel-defining layer 219 may include an inorganic insulating material, such as silicon nitride, silicon oxynitride, or silicon oxide. Alternatively, the pixel-defining layer 219 may include an organic insulating material and an inorganic insulating material. In some embodiments, the pixel-defining layer 219 may include a light-shielding material and may be provided as a black color. The light-shielding material may include a resin or paste including carbon black, a carbon nano-tube, and a black dye, a metal particle, such as Ni, Al, Mo, and an alloy thereof, a metal oxide particle (for example, chromium oxide), a metal nitride particle (for example, chromium nitride), or the like. When the pixel-defining layer 219 includes a light-shielding material, reflection of external light due to metal structures arranged below the pixel-defining layer 219 may be reduced.

The intermediate layer 320 may be arranged in an opening formed by the pixel-defining layer 219. The intermediate layer 320 may include an organic emission layer. The organic emission layer may include an organic material including a fluorescent or phosphorescent material for emitting red, green, blue, or white light. The organic emission layer may include a low molecular-weight organic material or a high molecular-weight organic material. Also, a functional layer, such as a hole transport layer (HTL), a hole injection layer (HIL), an electron transport layer (ETL), or an electron injection layer (EIL), may be selectively further arranged above and below the organic emission layer.

The intermediate layer 320 may be arranged to correspond to each of the plurality of pixel electrodes 310. However, the intermediate layer 320 is not limited thereto. The intermediate layer 320 may be integrally formed throughout the plurality of pixel electrodes 310. Like this, the intermediate layer 320 may have various modifications.

The opposite electrode 330 may include a transmissive electrode or a reflection electrode. In some embodiments, the opposite electrode 330 may include a transparent or semi-transparent electrode and may include a metal thin-film having a low work function, such as Li, Ca, LiF/Ca, LiF/Al, Al, Ag, Mg, and a compound thereof. Also, a transparent conductive oxide (TCO) layer, such as ITO, IZO, ZnO, or $In_2O_3$, may further be arranged above the metal thin-film.

The opposite electrode 330 may be arranged on the entire display and may be arranged above the intermediate layer 320 and the pixel-defining layer 219. The opposite electrode 330 may be integrally formed with respect to the plurality of light-emitting devices 300 and may correspond to the plurality of pixel electrodes 310.

The light-emitting device 300 may be covered by an encapsulation layer (not shown). The encapsulation layer may include at least one organic encapsulation layer and at least one inorganic encapsulation layer.

The inorganic encapsulation layer may include at least one inorganic material from among aluminum oxide, titanium oxide, tantalum oxide, hafnium oxide, zinc oxide, silicon oxide, silicon nitride, and silicon oxynitride. A first inorganic encapsulation layer and a second inorganic encapsulation layer may include a single layer or layers including the materials described above. The organic encapsulation layer may include a polymer-based material. The polymer-based material may include acryl-based resins, such as polymethylmethacrylate and polyacrylic acid, epoxy-based resins, polyimide, polyethylene, etc. According to an embodiment, the organic encapsulation layer may include acrylate polymers.

Figure 6:
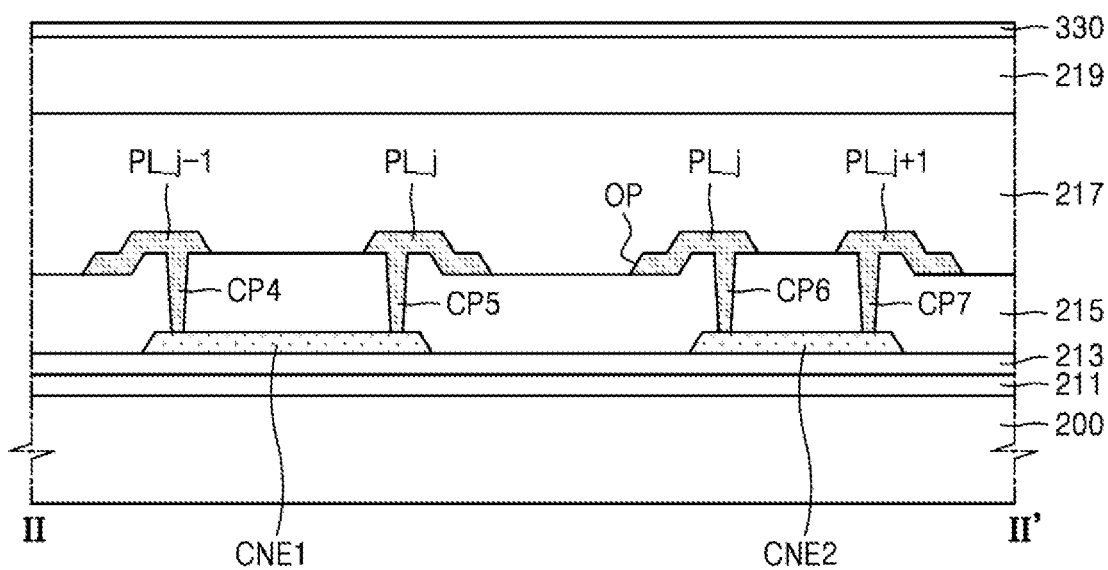
FIG. 6 is an example cross-sectional view of a region of FIG. 3, taken along line II-II'.

FIG. 6 is an example cross-sectional view of a region of FIG. 3, taken along line and may omit one or more components. In FIG. 6, reference signs that are the same as the reference signs in FIG. 5 denote members that are the same as the members in FIG. 5, and thus, their descriptions are not repeated.

Referring to FIG. 6, the first connection electrode CNE1 and the second connection electrode CNE2 may be arranged between the gate insulating layer 213 and the interlayer insulating layer 215. The first connection electrode CNE1 and the second connection electrode CNE2 may be arranged on the same layer as the first-through-third scan lines GWL_i, GIL_i, and GBL_i (see FIG. 3), the emission control line EML_i (see FIG. 3), and the first electrode CE1 (see FIG. 3). The first connection electrode CNE1 and the second connection electrode CNE2 may include a conductive material including Mo, Al, Cu, Ti, or the like and may include layers or a single layer including the materials described above.

The first power line PL_j−1, the second power line PL_j, and the third power line PL_j+1 may be arranged between the interlayer insulating layer 215 and the planarization layer 217. The first power line PL_j−1, the second power line PL_j, and the third power line PL_j+1 may be arranged on the same layer as the third connection electrode CNE3 (see FIG. 3), the fourth connection electrode CNE4 (see FIG. 3), the first voltage line VL1 (see FIG. 3), the second voltage line VL2 (see FIG. 3), etc. The first power line PL_j−1, the second power line PL_j, and the third power line PL_j+1 may include a conductive material including Mo, Al, Cu, Ti, or the like and may include layers or a single layer including the materials described above.

The first power line PL_j−1 may be connected to the first connection electrode CNE1 through a contact hole formed in the interlayer insulating layer 215. A portion of the first power line PL_j−1 may be buried in the contact hole, and the portion of the first power line PL_j−1 being buried in the contact hole, may be referred to as the fourth contact plug CP4. In other words, the first power line PL_j−1 and the fourth contact plug CP4 may be integral with each other.

The second power line PL_j may be connected to the first connection electrode CNE1 through a contact hole formed in the interlayer insulating layer 215. A portion of the second power line PL_j may be buried in the contact hole, and the portion of the second power line PL_j being buried in the contact hole may be referred to as the fifth contact plug CP5. In other words, the second power line PL_j and the fifth contact plug CP5 may be integral with each other.

As described above, the first power line PL_j−1 and the second power line PL may be connected to each other through the first connection electrode CNE1. The first connection electrode CNE1 may function as a bridge connecting the first power line PL_j−1 with the second power line PL_j.

The second power line PL_j may be connected to the second connection electrode CNE2 through a contact hole formed in the interlayer insulating layer 215. A portion of the second power line PL_j may be buried in the contact hole, and the portion of the second power line PL_j being buried in the contact hole may be referred to as the sixth contact plug CP6. In other words, the second power line PL_j and the sixth contact plug CP6 may be integral with each other.

The third power line PL_j+1 may be connected to the second connection electrode CNE2 through a contact hole formed in the interlayer insulating layer 215. A portion of the third power line PL_j+1 may be buried in the contact hole, and the portion of the third power line PL_j+1 being buried in the contact hole may be referred to as the seventh contact plug CP7. In other words, the third power line PL_j+1 and the seventh contact plug CP7 may be integral with each other.

As described above, the second power line PL_j and the third power line PL_j+1 may be connected to each other through the second connection electrode CNE2. The second connection electrode CNE2 may function as a bridge connecting the second power line PL with the third power line PL_j+1.

The second power line PL_j may have an opening OP exposing a portion of the interlayer insulating layer 215 as illustrated in FIG. 6. Although the descriptions are given based on the second power line PL_j, the descriptions may be likewise applied to the first power line PL_j−1 and the third power line PL_j+1.

Figure 7:
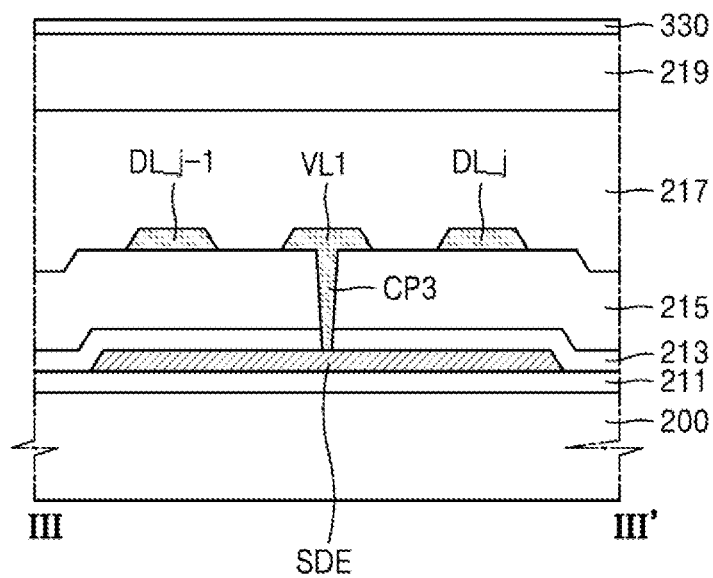
FIG. 7 is an example cross-sectional view of a region of FIG. 3, taken along line III-III'.

FIG. 7 is an example cross-sectional view of a region of FIG. 3, taken along line and may omit one or more components. In FIG. 7, reference signs that are the same as the reference signs in FIG. 5 denote members that are the same as the members in FIG. 5, and thus, their descriptions are not repeated.

Referring to FIG. 7, the shielding electrode SDE may be arranged between the buffer layer 211 and the gate insulating layer 213. The shielding electrode SDE may be arranged on the same layer as the semiconductor pattern Act. The shielding electrode SDE may include a single layer or layers. The shielding electrode SDE may include amorphous silicon or polysilicon. The shielding electrode SDE may be doped with a dopant.

According to another embodiment, the shielding electrode SDE may include an oxide semiconductor material. For example, the shielding electrode SDE may include an oxide of at least one material selected from the group consisting of In, Ga, Sn, Zr, V, Hf, Cd, Ge, Cr, Ti, Al, Cs, Ce, and Zn.

FIG. 7 illustrates that the shielding electrode SDE is arranged between the buffer layer 211 and the gate insulating layer 213. However, according to another embodiment, the shielding electrode SDE may be arranged between the gate insulating layer 213 and the interlayer insulating layer 215. In this case, the shielding electrode SDE may include a conductive material including Mo, Al, Cu, Ti, or the like and may include layers or a single layer including the materials described above.

The first data line DL_j−1, the first voltage line VL1, and the second data line DL_j may be arranged between the interlayer insulating layer 215 and the planarization layer 217. The first data line DL_j−1, the first voltage line VL1, and the second data line DL_j may be arranged on the same layer as the third connection electrode CNE3 (see FIG. 3), the fourth connection electrode CNE4 (see FIG. 3), the second voltage line VL2 (see FIG. 3), etc. The first data line DL_j−1, the first voltage line VL1, and the second data line DL_j may include a conductive material including Mo, Al, Cu, Ti, or the like and may include layers or a single layer including the materials described above.

The first voltage line VL1 may be connected to the shielding electrode SDE through a contact hole formed in the gate insulating layer 213 and the interlayer insulating layer 215. A portion of the first voltage line VL1 may be buried in the contact hole, and the portion of the first voltage line VL1 being buried in the contact hole may be referred to as the third contact plug CP3. In other words, the first voltage line VL1 and the third contact plug CP3 may be integral with each other.

The first data line DL_j−1 and the second data line DL_j may at least partially overlap the shielding electrode SDE. As described above, when the shielding electrode SDE to which the first initialization voltage VINT1 (see FIG. 2) is applied at least partially overlaps the first data line DL_j−1 and the second data line DL_j, the first data line DL_j−1 and the second data line DL_j may be shielded. A parasitic capacitance between the first data line DL_j−1 and the second data line DL_j and electrodes adjacent thereto may be blocked.

FIG. 8 is a schematic plan view of the plurality of pixels PX according to an embodiment. FIG. 8 illustrates a modified embodiment of FIG. 3 and is different from the embodiment of FIG. 3 in terms of a structure of a semiconductor material layer, power lines, etc. Hereinafter, FIG. 8 is to be referred to for the same aspects, and differences are mainly described.

Referring to FIG. 8, the first pixel PXi(j−1) and the second pixel PXij may be connected to the first voltage line VL1 through the first contact plug CP1, and the second pixel PXij and the third pixel PXi(j+1) may be connected to the second voltage line VL2 through the second contact plug CP2. In other words, the first pixel PXi(j−1) and the second pixel PXij may receive the first initialization voltage VINT1 through the first contact plug CP1, and the second pixel PXij and the third pixel PXi(j+1) may receive the second initialization voltage VINT2 through the second contact plug CP2. In other words, the first pixel PXi(j−1) and the second pixel PXij may share the first contact plug CP1, and the second pixel PXij and the third pixel PXi(j+1) may share the second contact plug CP2. In other words, the first pixel PXi(j−1) and the second pixel PXij may share the first voltage line VL1, and the second pixel PXij and the third pixel PXi(j+1) may share the second voltage line VL2.

Based on the second pixel PXij, the second pixel PXij may share the first contact plug CP1 with the first pixel PXi(j−1) arranged in a previous column and may share the second contact plug CP2 with the third pixel PXi(j+1) arranged in a next column. Although not illustrated in FIG. 2, the first pixel PXi(j−1) may share the second contact plug CP2 with a pixel arranged in a previous column, like the second pixel PXij and the third pixel PXi(j+1) share the second contact plug CP2. Based on the first pixel PXi(j−1), the first pixel PXi(j−1) may share the second contact plug CP2 with the pixel arranged in the previous column and may share the first contact plug CP1 with the second pixel PXij arranged in a next column. The third pixel PXi(j+1) may share the first contact plug CP1 with a pixel arranged in a next column, like the first pixel PXi(j−1) and the second pixel PXij share the first contact plug CP1. Based on the third pixel PXi(j+1), the third pixel PXi(j+1) may share the second contact plug CP2 with the second pixel PXij arranged in a previous column and may share the first contact plug CP1 with the pixel arranged in the next column. As described above, the pixels arranged in the $i^{th}$ row may be connected to each other through the first contact plugs CP1 and the second contact plugs CP2 alternately arranged in the second direction DR2.

According to an embodiment, the first voltage line VL1 and the second voltage line VL2 each may be provided in plurality. The first voltage lines VL1 and the second voltage lines VL2 may be alternately arranged with each other in the second direction DR2. In other words, as illustrated in FIG. 8, the number of pixels arranged in the $i^{th}$ row between first voltage lines VL1 adjacent to each other in the second direction DR2 from among the plurality of first voltage lines VL1 may be 2. The number of pixels arranged in the $i^{th}$ row between second voltage lines VL2 adjacent to each other in the second direction DR2 from among the plurality of second voltage lines VL2 may be 2.

As described above, part or all of the pixels PX may share the first contact plug CP1 and/or the second contact plug CP2 and may receive the first initialization voltage VINT1 and/or the second initialization voltage VINT2. In this case, the number of first voltage lines VL1 configured to supply the first initialization voltage VIN1 may be less than the number of pixels (or the number of pixel columns) in the second direction DR2. The number of second voltage lines VL2 configured to supply the second initialization voltage VINT2 may be less than the number of pixel columns. Alternatively, the sum of the number of first voltage lines VL1 and the number of second voltage lines VL2 may be less than the number of pixel columns.

According to an embodiment, a first shielding electrode SDE1 may be arranged between the first pixel PXi(j−1) and the second pixel PXij. The first shielding electrode SDE1 may be connected to the first voltage line VL1 through a 3-$1^{st}$ contact plug CP3-1. The first shielding electrode SDE1 may receive the first initialization voltage VINT1 (see FIG. 2) through the 3-$1^{st}$ contact plug CP3-1.

The second data line DL_j configured to transmit the second data voltage Dm_j (see FIG. 2) to the second pixel PXij may at least partially overlap the first shielding electrode SDE1. Like this, when the first shielding electrode SDE1 to which the first initialization voltage VINT1 is applied at least partially overlaps the second data line DL_j, the second data line DL_j may be shielded, and a parasitic capacitance between the second data line DL_j and adjacent electrodes may be blocked. For example, the parasitic capacitance between the second data line DL_j and the first electrode CE1 (corresponding to the gate of the driving transistor) adjacent to the second data line DL_j may be blocked. A change of the driving current Id of the light-emitting device OLED due to a change of a voltage of the first electrode CE1 according to a change of the second data voltage Dm_j may be prevented. That is, crosstalk, which is a change in luminance due to the parasitic capacitance between the second data line DL_j−1 and the first electrode CE1, may be prevented.

The first shielding electrode SDE1 may also be arranged between the third pixel PXi(j+1) and the pixel arranged in the next column. The number of pixels arranged in the $i^{th}$ row between the first shielding electrodes SDE1 adjacent to each other in the second direction DR2 may be 2. A data line configured to transmit a data voltage to a pixel arranged in a next column may at least partially overlap the first shielding electrode SDE1. As described above, when the first shielding electrode SDE1 to which the first initialization voltage VINT1 is applied at least partially overlaps the data line, the data line may be shielded, and a parasitic capacitance between the data line and adjacent electrodes may be blocked.

According to an embodiment, a second shielding electrode SDE2 may be arranged between the second pixel PXij and the third pixel PXi(j+1). The second shielding electrode SDE2 may be connected to the second voltage line VL2 through a 3-2$^{nd}$ contact plug CP3-2. The second shielding electrode SDE2 may receive the second initialization voltage VINT2 (see FIG. 2) through the 3-2$^{nd}$ contact plug CP3-2.

The third data line DL_j+1 configured to transmit the third data voltage Dm_j+1 (see FIG. 2) to the third pixel PXi(j+1) may at least partially overlap the second shielding electrode SDE2. As described above, when the second shielding electrode SDE2 to which the second initialization voltage VINT2 is applied at least partially overlaps the third data line DL_j+1, the third data line DL_j+1 may be shielded, and a parasitic capacitance between the third data line DL_j+1 and adjacent electrodes may be blocked.

The second shielding electrode SDE2 may also be arranged between the first pixel PXi(j−1) and a pixel arranged in a previous column. The number of pixels arranged in the i$^{th}$ row between the second shielding electrodes SDE2 adjacent to each other in the second direction DR2 may be 2. The first data line DL_j−1 configured to transmit the first data voltage Dm_j−1 (see FIG. 2) to the first pixel PXi(j−1) may at least partially overlap the second shielding electrode SDE2. As described above, when the second shielding electrode SDE2 to which the second initialization voltage VINT2 is applied at least partially overlaps the first data line DL_j−1, the first data line DL_j−1 may be shielded, and a parasitic capacitance between the first data line DL_j−1 and adjacent electrodes may be blocked.

The first shielding electrode SDE1 and the second shielding electrode SDE2 each may be provided in plurality. The plurality of first shielding electrodes SDE1 and the plurality of second shielding electrodes SDE2 may be alternately arranged with each other in the second direction DR2.

According to an embodiment, a third shielding electrode SDE3 may be arranged to be adjacent to the first shielding electrode SDE1 in the first direction DR1. The third shielding electrode SDE3 may be arranged between the first pixel PXi(j−1) and the second pixel PXij. The third shielding electrode SDE3 may be connected to the second power line PL_j through the ninth contact plug CP9. The third shielding electrode SDE3 may receive the first driving voltage ELVDD (see FIG. 2) through the ninth contact plug CP9. The first driving voltage ELVDD may be applied to the third shielding electrode SDE3.

The third shielding electrode SDE3 may extend from a semiconductor pattern Act'. The third shielding electrode SDE3 may extend from the source of the first emission control transistor T5. The third shielding electrode SDE3 may be integral with the semiconductor pattern Act'.

The second data line DL_j configured to transmit the second data voltage Dm_j to the second pixel PXij may at least partially overlap the third shielding electrode SDE3. As described above, when the third shielding electrode SDE3 to which the first driving voltage ELVDD is applied at least partially overlaps the second data line DL_j, the second data line DL_j may be shielded, and a parasitic capacitance between the second data line DL_j and adjacent electrodes may be blocked.

The third shielding electrode SDE3 may be arranged to be adjacent, in the first direction DR1, to the first shielding electrode SDE1 arranged between the third pixel PXi(j+1) and the pixel arranged in the next column. The third shielding electrode SDE3 may be arranged between the third pixel PXi(j+1) and the pixel arranged in the next column. The number of pixels arranged in the i$^{th}$ between the third shielding electrodes SDE3 adjacent to each other in the second direction DR2 may be 2. A data line configured to transmit a data voltage to a pixel arranged in a next column may at least partially overlap the third shielding electrode SDE3. As described above, when the third shielding electrode SDE3 to which the first driving voltage ELVDD is applied at least partially overlaps the data line, the data line may be shielded, and a parasitic capacitance between the data line and adjacent electrodes may be blocked.

According to an embodiment, a fourth shielding electrode SDE4 may be arranged to be adjacent to the second shielding electrode SDE2 in the first direction DR1. The fourth shielding electrode SDE4 may be arranged between the second pixel PXij and the third pixel PXi(j+1). The fourth shielding electrode SDE4 may be connected to the third power line PL_j+1 through the ninth contact plug CP9. The fourth shielding electrode SDE4 may receive the first driving voltage ELVDD through the ninth contact plug CP9. The first driving voltage ELVDD may be applied to the fourth shielding electrode SDE4.

The fourth shielding electrode SDE4 may extend from the semiconductor pattern Act'. The fourth shielding electrode SDE4 may extend from the source of the first emission control transistor T5. The fourth shielding electrode SDE4 may be integral with the semiconductor pattern Act'.

The third data line DL_j+1 configured to transmit the third data voltage Dm_j+1 to the third pixel PXi(j+1) may at least partially overlap the fourth shielding electrode SDE4. As described above, when the fourth shielding electrode SDE4 to which the first driving voltage ELVDD is applied at least partially overlaps the third data line DLj+1, the third data line DL_j+1 may be shielded, and a parasitic capacitance between the third data line DL_j+1 and adjacent electrodes may be blocked.

The fourth shielding electrode SDE4 may be arranged to be adjacent, in the first direction DR1, to the second shielding electrode SDE2 arranged between the first pixel PXi(j−1) and the pixel arranged in the previous column. The fourth shielding electrode SDE4 may be arranged between the first pixel PXi(j−1) and the pixel arranged in the previous column. The number of pixels arranged in the i$^{th}$ row between the fourth shielding electrodes SDE4 adjacent to each other in the second direction DR2 may be 2. The first data line DL_j−1 configured to transmit the first data voltage Dm_j−1 to the first pixel PXi(j−1) may at least partially overlap the fourth shielding electrode SDE4. As described above, when the fourth shielding electrode SDE4 to which the first driving voltage ELVDD is applied at least partially overlaps the first data line DL_j−1, the first data line DL_j−1 may be shielded, and a parasitic capacitance between the first data line DL_j−1 and adjacent electrodes may be blocked.

The third shielding electrode SDE3 and the fourth shielding electrode SDE4 each may be provided in plurality. The plurality of third shielding electrodes SDE3 and the plurality of fourth shielding electrodes SDE4 may be alternately arranged with each other in the second direction DR2.

According to an embodiment, the first power line PL_j−1, the second power line PL_j, and the third power line PL_j+1 may be sequentially arranged and apart from each other in the first direction DR1. The first power line PL_j−1, the second power line PL_j, and the third power line PL_j+1 may extend in the second direction DR2. Each of the first power line PL_j−1, the second power line PL_j, and the third power line PL_j+1 may have an opening OP exposing at least a portion of an insulating layer arranged below each of the first power line PL_j−1, the second power line PL_j, and the third power line PL_j+1. The first power line PL_j−1, the second power line PL_j, and the third power line PL_j+1 may have the same plan shape.

According to an embodiment, the first power line PL_j−1 and the second power line PL_j may be connected to each other through the first connection electrode CNE1. The first power line PL_j−1 may be connected to the first connection electrode CNE1 through the fourth contact plug CP4, and the second power line PL_j may be connected to the first connection electrode CNE1 through the fifth contact plug CP5. The second power line PL_j and the third power line PL_j+1 may be connected to each other through the second connection electrode CNE2. The second power line PL_j may be connected to the second connection electrode CNE2 through the sixth contact plug CP6, and the third power line PL_j+1 may be connected to the second connection electrode CNE2 through the seventh contact plug CP7. As described above, because the power lines apart from each other are connected to each other via the connection electrodes, the lines to which the first driving voltage ELVDD is applied may have a mesh structure.

According to an embodiment, the first connection electrode CNE1 and the second connection electrode CNE2 may extend in the second direction DR2. A first length $\ell 1$ of the first connection electrode CNE1 in the second direction DR2 may be substantially the same as a second length $\ell 2$ of the second connection electrode CNE2 in the second direction DR2.

The first connection electrode CNE1 and the second connection electrode CNE2 may be arranged between the first scan line GWL_i and the second scan line GIL_i.

The first connection electrode CNE1 and the second connection electrode CNE2 each may be provided in plurality. The plurality of first connection electrodes CNE1 and the plurality of second connection electrodes CNE2 may be alternately arranged with each other in the second direction DR2.

Figure 9:
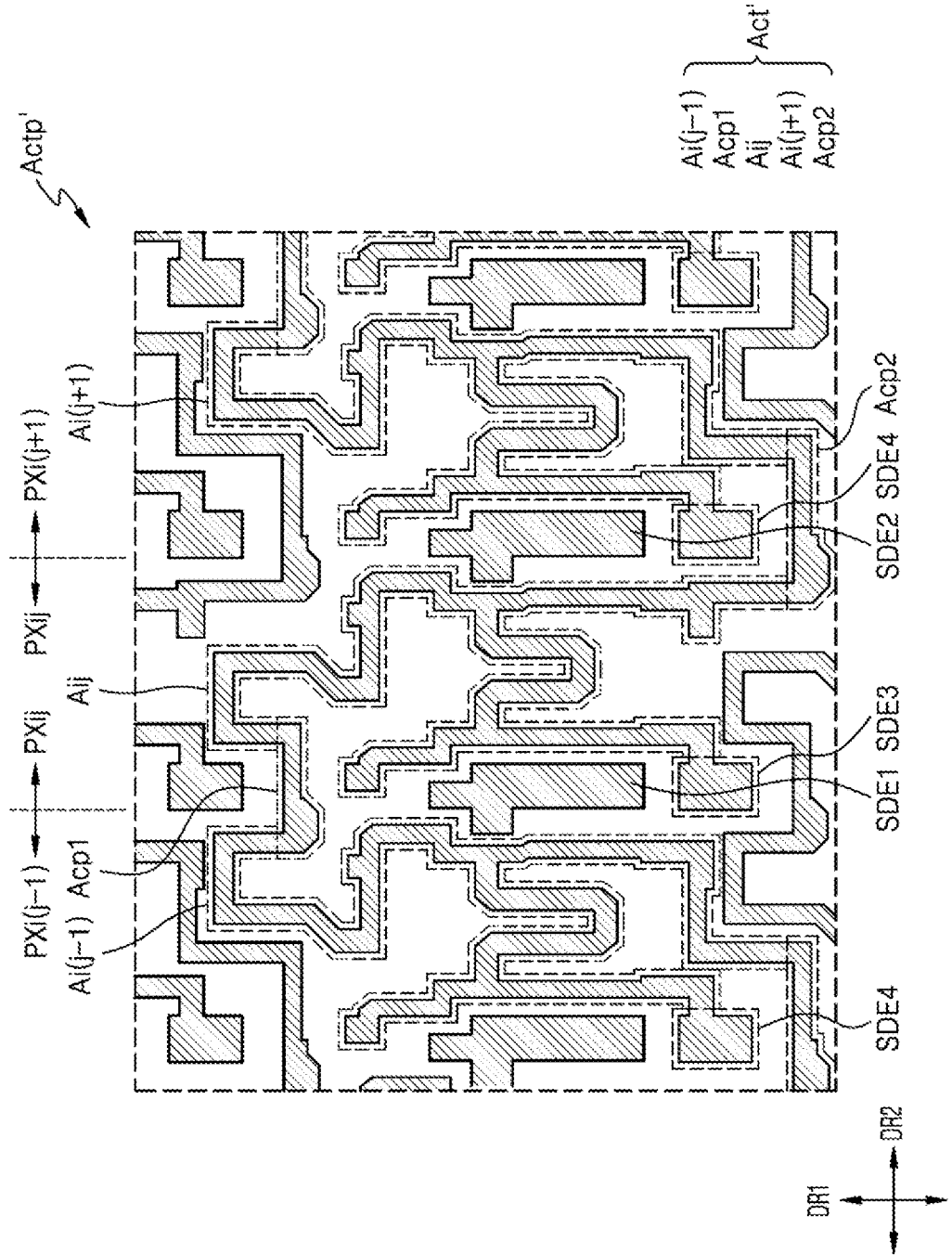
FIG. 9 is a view of a semiconductor material layer of FIG. 8.

FIG. 9 illustrates a semiconductor material layer Actp' of FIG. 8.

Referring to FIG. 9, the semiconductor material layer Actp' may include the semiconductor pattern Act', the first shielding electrode SDE1, the second shielding electrode SDE2, the third shielding electrode SDE3, and the fourth shielding electrode SDE4.

The semiconductor pattern Act' may continually extend in a second direction DR2. The semiconductor pattern Act' may extend in the second direction DR2 without a break and may be integrally formed. Although the semiconductor pattern Act' illustrated in FIG. 9 may partially extend in the first direction DR1, the semiconductor pattern Act' may generally extend in the second direction DR2. In other words, the semiconductor pattern Act' may microscopically include a portion extending in the first direction DR1, but may generally extend in the second direction DR2.

The semiconductor pattern Act' may include the plurality of pixel areas Ai(j−1), Aij, and Ai(j+1) and the plurality of first contact areas Acp1 and the plurality of second contact areas Acp2 arranged between the plurality of pixel areas Ai(j−1), Aij, and Ai(j+1).

The plurality of pixel areas Ai(j−1), Aij, and Ai(j+1) may be included in the plurality of pixels PXi(j−1), PXij, and PXi(j+1), respectively. The plurality of first contact areas Acp1 may correspond to the plurality of first contact plugs CP1, respectively, and the plurality of second contact areas Acp2 may correspond to the plurality of second contact plugs CP2, respectively. Alternatively, the plurality of first contact areas Acp1 may directly contact the plurality of first contact plugs CP1, respectively, and the plurality of second contact areas Acp2 may directly contact the plurality of second contact plugs CP2, respectively.

According to an embodiment, the first contact areas Acp1 and the second contact areas Acp2 may be alternately arranged with each other in the second direction DR2.

The first contact area Acp1 may connect the pixel area Ai(j−1) of the first pixel PXi(j−1) with the pixel area Aij of the second pixel PXij, and the second contact area Acp2 may connect the pixel area Aij of the second pixel PXij with the pixel area Ai(j+1) of the third pixel PXi(j+1). As described above with reference to FIG. 2, the first pixel PXi(j−1) may share the second contact plug CP2 with the pixel arranged in the previous column, like the second pixel PXij and the third pixel PXi(j+1) share the second contact plug CP2, and the third pixel PXi(j+1) may share the first contact plug CP1 with the pixel arranged in the next column, like the first pixel PXi(j−1) and the second pixel PXij share the first contact plug CP1. Thus, the pixel area Ai(j−1) of the first pixel PXi(j−1) and a pixel area of the pixel arranged in the previous column may be connected with each other via the second contact area Acp2, and the pixel area Ai(j+1) of the third pixel PXi(j+1) and a pixel area of the pixel arranged in the next column may be connected with each other via the first contact area Acp1.

As described according to an embodiment, when the semiconductor pattern Act' continually extends in the second direction DR2, static electricity generated (or introduced) from the outside may not be isolated and may be distributed (or diffused) in the second direction DR2. Accordingly, because the static electricity may not be isolated in the semiconductor pattern Act' and may be distributed in the second direction DR2, damage to the semiconductor pattern Act' may be prevented.

The first shielding electrode SDE1 may be arranged to be apart from the semiconductor pattern Act'. The first shielding electrode SDE1 may be arranged on the same layer as the semiconductor pattern Act'. The first initialization voltage VINT1 may be applied to the first shielding electrode SDE1 through the $3\text{-}1^{st}$ contact plug CP3-1, as described above with reference to FIG. 8. The first shielding electrode SDE1 may be arranged between the pixel area Ai(j−1) of the first pixel PXi(j−1) and the pixel area Aij of the second pixel PXij. The first shielding electrode SDE1 may be arranged between the pixel area Ai(j+1) of the third pixel PXi(j+1) and a pixel area of a pixel arranged in a next column with respect to the third pixel PXi(j+1).

The second shielding electrode SDE2 may be arranged to be apart from the semiconductor pattern Act'. The second shielding electrode SDE2 may be arranged on the same layer as the semiconductor pattern Act'. The second initialization voltage VINT2 may be applied to the second shielding electrode SDE2 through the $3\text{-}2^{nd}$ contact plug CP3-2, as described above with reference to FIG. 8. The second shielding electrode SDE2 may be arranged between the pixel area Aij of the second pixel PXij and the pixel area Ai(j+1) of the third pixel PXi(j+1). The second shielding electrode SDE2 may be arranged between the pixel area Ai(j−1) of the first pixel PXi(j−1) and a pixel area of a pixel arranged in a previous column with respect to the first pixel PXi(j−1).

The first shielding electrode SDE1 and the second shielding electrode SDE2 each may be provided in plurality. The plurality of first shielding electrodes SDE1 and the plurality of second shielding electrodes SDE2 may be alternately arranged with each other in the second direction DR2.

The third shielding electrode SDE3 may be arranged to be adjacent to the first shielding electrode SDE1 in the first direction DR1. The third shielding electrode SDE3 may extend from the semiconductor pattern Act'. The third shielding electrode SDE3 may be integral with the semiconductor pattern Act'. The third shielding electrode SDE3 may extend from the pixel area Aij of the second pixel PXij. The third shielding electrode SDE3 may extend from the pixel area of the pixel arranged in the next column with respect to the third pixel PXi(j+1).

The third shielding electrode SDE3 may be arranged between the pixel area Ai(j−1) of the first pixel PXi(j−1) and the pixel area Aij of the second pixel PXij. The third shielding electrode SDE3 may be arranged between the pixel area Ai(j+1) of the third pixel PXi(j+1) and the pixel area of the pixel arranged in the next column with respect to the third pixel PXi(j+1). The first driving voltage ELVDD may be applied to the third shielding electrode SDE3 through the ninth contact plug CP9, as described above with reference to FIG. 8.

The fourth shielding electrode SDE4 may be arranged to be adjacent to the second shielding electrode SDE2 in the first direction DR1. The fourth shielding electrode SDE4 may extend from the semiconductor pattern Act'. The fourth shielding electrode SDE4 may be integral with the semiconductor pattern Act'. The fourth shielding electrode SDE4 may extend from the pixel area Ai(j−1) of the first pixel PXi(j−1). The fourth shielding electrode SDE4 may extend from the pixel area Ai(j+1) of the third pixel PXi(j+1).

The fourth shielding electrode SDE4 may be arranged between the pixel area Aij of the second pixel PXij and the pixel area Ai(j+1) of the third pixel PXi(j+1). The fourth shielding electrode SDE4 may be arranged between the pixel area Ai(j−1) of the first pixel PXi(j−1) and the pixel area of the pixel arranged in the previous column with respect to the first pixel PXi(j−1). The first driving voltage ELVDD may be applied to the fourth shielding electrode SDE4 through the ninth contact plug CP9, as described above with reference to FIG. 8.

The third shielding electrode SDE3 and the fourth shielding electrode SDE4 each may be provided in plurality. The plurality of third shielding electrodes SDE3 and the plurality of fourth shielding electrodes SDE4 may be alternately arranged with each other in the second direction DR2.

Figure 10:
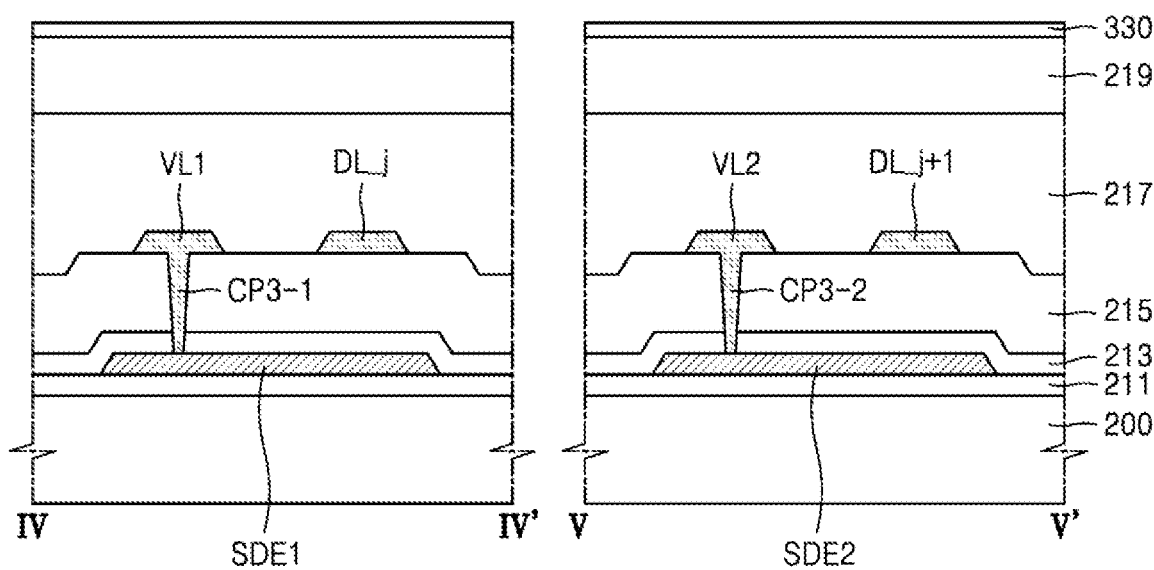
FIG. 10 is an example cross-sectional view of a region of FIG. 8, taken along lines IV-IV' and V-V'.

FIG. 10 is an example cross-sectional view of a region of FIG. 8, taken along lines IV-IV' and V-V', and may omit one or more components. In FIG. 10, reference signs that are the same as the reference signs in FIG. 5 denote members that are the same as the members in FIG. 5, and thus, their descriptions are not repeated.

Referring to FIG. 10, the first shielding electrode SDE1 and the second shielding electrode SDE2 may be arranged between the buffer layer 211 and the gate insulating layer 213. The first shielding electrode SDE1 and the second shielding electrode SDE2 may be arranged on the same layer as the semiconductor pattern Act'. The first shielding electrode SDE1 and the second shielding electrode SDE2 may include a single layer or layers. The first shielding electrode SDE1 and the second shielding electrode SDE2 may include amorphous silicon or polysilicon. The shielding electrode SDE may be doped with a dopant.

According to another embodiment, the first shielding electrode SDE1 and the second shielding electrode SDE2 may include an oxide semiconductor material. For example, the first shielding electrode SDE1 and the second shielding electrode SDE2 may include an oxide of at least one material selected from the group consisting of In, Ga, Sn, Zr, V, Hf, Cd, Ge, Cr, Ti, Al, Cs, Ce, and Zn.

FIG. 10 illustrates that the first shielding electrode SDE1 and the second shielding electrode SDE2 are arranged between the buffer layer 211 and the gate insulating layer 213. However, according to another embodiment, the first shielding electrode SDE1 and the second shielding electrode SDE2 may be arranged between the gate insulating layer 213 and the interlayer insulating layer 215. In this case, the first shielding electrode SDE1 and the second shielding electrode SDE2 may include a conductive material including Mo, Al, Cu, Ti, or the like and may include layers or a single layer including the materials described above.

Although the descriptions are given based on the first shielding electrode SDE1 and the second shielding electrode SDE2, the descriptions may be likewise applied to the third shielding electrode SDE3 and the fourth shielding electrode SDE4.

The first voltage line VL1, the second data line DL_j, the second voltage line VL2, and the third data line DL_j+1 may be arranged between the interlayer insulating layer 215 and the planarization layer 217. The first voltage line VL1, the second data line DL_j, the second voltage line VL2, and the third data line DL_j+1 may include a conductive material including Mo, Al, Cu, Ti, or the like and may include layers or a single layer including the materials described above.

The first voltage line VL1 may be connected to the first shielding electrode SDE1 through a contact hole formed in the gate insulating layer 213 and the interlayer insulating layer 215. A portion of the first voltage line VL1 may be buried in the contact hole, and the portion of the first voltage line VL1, the portion being buried in the contact hole, may be referred to as the 3-1$^{st}$ contact plug CP3-1. In other words, the first voltage line VL1 and the 3-1$^{st}$ contact plug CP3-1 may be integral with each other.

The second data line DL_j may at least partially overlap the first shielding electrode SDE1. As described above, when the first shielding electrode SDE1 to which the first initialization voltage VINT1 (see FIG. 2) is applied at least partially overlaps the second data line DL_j, the second data line DL_j may be shielded. A parasitic capacitance between the second data line DL_j and adjacent electrodes may be blocked.

The second voltage line VL2 may be connected to the second shielding electrode SDE2 through a contact hole formed in the gate insulating layer 213 and the interlayer insulating layer 215. A portion of the second voltage line VL2 may be buried in the contact hole, and the portion of the second voltage line VL2, the portion being buried in the contact hole, may be referred to as the 3-2$^{nd}$ contact plug CP3-2. In other words, the second voltage line VL2 and the 3-2$^{nd}$ contact plug CP3-2 may be integral with each other.

The third data line DL_j+1 may at least partially overlap the second shielding electrode SDE2. As described above, when the second shielding electrode SDE2 to which the second initialization voltage VINT2 (see FIG. 2) is applied at least partially overlaps the third data line DL_j+1, the third data line DL_j+1 may be shielded. A parasitic capacitance between the third data line DL_j+1 and adjacent electrodes may be blocked.

The descriptions above are mainly given with respect to the display apparatus. However, the disclosure is not limited thereto. In other words, a method of manufacturing the display apparatus may also be included in the scope of the disclosure.

According to various embodiments of the disclosure, by integrally forming a semiconductor pattern continually extending in a direction, the defects in a pixel, for example, caused by a damage to the semiconductor pattern due to external static electricity, may be reduced in number. Thus, defects in the display apparatus may be prevented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   first-through-third pixels sequentially arranged in a row direction;
   a first shielding electrode arranged between the first pixel and the second pixel;
   a first voltage line configured to transmit a first initialization voltage;
   a second voltage line configured to transmit a second initialization voltage;
   a first contact plug connecting the first pixel and the second pixel to the first voltage line;
   a second contact plug connecting the second pixel and the third pixel to the second voltage line; and
   a third contact plug connecting the first shielding electrode to the first voltage line.

2. The display apparatus of claim 1, further comprising:
   a second shielding electrode arranged between the second pixel and the third pixel; and
   a fourth contact plug connecting the second shielding electrode to the second voltage line.

3. The display apparatus of claim 1, further comprising first-through-third power lines sequentially arranged and apart from each other in the row direction,
   wherein:
   the first power line is configured to transmit a driving voltage to the first pixel;
   the second power line is configured to transmit the driving voltage to the second pixel; and
   the third power line is configured to transmit the driving voltage to the third pixel.

4. The display apparatus of claim 3, further comprising:
   a third shielding electrode adjacent to the first shielding electrode in a column direction; and
   at least one fifth contact plug connecting the third shielding electrode to at least one of the first-through-third power lines.

5. The display apparatus of claim 3, wherein:
   the first voltage line extends in a column direction and arranged between the first power line and the second power line;
   the second voltage line extends in the column direction and arranged between the second power line and the third power line;
   the first power line and the second power line are symmetrical with each other with respect to the first voltage line; and
   the second power line and the third power line are symmetrical with each other with respect to the second voltage line.

6. The display apparatus of claim 3, wherein the first-through-third power lines have a same shape in a plan view.

7. The display apparatus of claim 3, further comprising:
   a first connection electrode connecting the first power line with the second power line; and
   a second connection electrode connecting the second power line with the third power line,
   wherein:
   the first-through-third power lines extend in a column direction; and
   the first connection electrode and the second connection electrode extend in the row direction.

8. The display apparatus of claim 7, wherein a first length of the first connection electrode in the row direction is greater than a second length of the second connection electrode in the row direction.

9. The display apparatus of claim 7, wherein a first length of the first connection electrode in the row direction is equal to a second length of the second connection electrode in the row direction.

10. The display apparatus of claim 1, further comprising:
    a first data line configured to transmit a first data voltage to the first pixel; and
    a second data line configured to transmit a second data voltage to the second pixel,
    wherein the first data line and the second data line at least partially overlap the first shielding electrode.

11. The display apparatus of claim 1, wherein each of the first-through-third pixels comprises:
    a light-emitting device;
    a driving transistor configured to control a current flowing to the light-emitting device according to a gate-source voltage;
    a first initialization transistor configured to apply one of the first initialization voltage and the second initialization voltage to an electrode of the driving transistor in response to a first scan signal; and
    a second initialization transistor configured to apply the other of the first initialization voltage and the second initialization voltage to an electrode of the light-emitting device in response to a second scan signal.

12. A display apparatus comprising:
    a semiconductor pattern integrally provided and continually extending in a row direction;
    at least one first shielding electrode arranged on a same layer as the semiconductor pattern and apart from the semiconductor pattern;
    at least one first voltage line configured to transmit a first initialization voltage; and
    at least one first contact plug connecting the at least one first shielding electrode to the at least one first voltage line.

13. The display apparatus of claim 12, further comprising:
    at least one second shielding electrode arranged on a same layer as the semiconductor pattern and apart from the semiconductor pattern;
    at least one second voltage line configured to transmit a second initialization voltage; and
    at least one second contact plug connecting the at least one second shielding electrode to the at least one second voltage line.

14. The display apparatus of claim 13, wherein:
the at least one first shielding electrode and the at least one second shielding electrode are provided in plurality; and
the plurality of first shielding electrodes and the plurality of second shielding electrodes are alternately arranged with each other in the row direction.

15. The display apparatus of claim 12, further comprising:
a plurality of power lines configured to transmit a driving voltage to the semiconductor pattern and arranged to be apart from each other in the row direction; and
a plurality of connection electrodes connecting power lines adjacent to each other in the row direction from among the plurality of power lines with each other, respectively.

16. The display apparatus of claim 15, further comprising an insulating layer arranged between the semiconductor pattern and the plurality of power lines,
wherein each of the plurality of power lines has an opening exposing at least a portion of the insulating layer.

17. The display apparatus of claim 12, further comprising at least one third shielding electrode, which extends from the semiconductor pattern, and to which a driving voltage is applied,
wherein the at least one first shielding electrode and the at least one third shielding electrode are adjacent to each other in a column direction.

18. The display apparatus of claim 12, further comprising:
a plurality of pixels arranged in the row direction; and a plurality of second voltage lines configured to transmit a second initialization voltage, wherein: the at least one first voltage line is provided in plurality, a pixel in a $2j-1^{th}$ column and a pixel in a $2j^{th}$ column from among the plurality of pixels share a plurality of first contact plugs connecting the pixel in the $2j-1^{th}$ column and the pixel in the $2j^{th}$ column to the plurality of first voltage lines; the pixel in the $2j^{th}$ column and a pixel in a $2j+1^{th}$ column from among the plurality of pixels share a plurality of second contact plugs connecting the pixel in the $2j^{th}$ column and the pixel in the $2j+1^{th}$ column to the plurality of second voltage lines; and
the semiconductor pattern includes a plurality of pixel areas included in the plurality of pixels, respectively, a plurality of first contact areas corresponding to the plurality of first contact plugs, respectively, and a plurality of second contact areas corresponding to the plurality of second contact plugs, respectively (where j is a natural number).

19. The display apparatus of claim 18, wherein:
2 the plurality of first contact areas connects a pixel area in the $2j-1^{th}$ column with a pixel area in the $2j^{th}$ column from among the plurality of pixel areas, respectively; and
the plurality of second contact areas connects the pixel area in the $2j^{th}$ column with a pixel area in the $2j+1^{th}$ column from among the plurality of pixel areas, respectively.

20. The display apparatus of claim 18, wherein the at last one first shielding electrode is provided in plurality, and
the plurality of first shielding electrodes is arranged between a pixel area in the $2j-1^{th}$ column and a pixel area in the $2j^{th}$ column from among the plurality of pixel areas, respectively.

* * * * *